(12) United States Patent
Kursun et al.

(10) Patent No.: US 6,900,666 B2
(45) Date of Patent: May 31, 2005

(54) DUAL THRESHOLD VOLTAGE AND LOW SWING DOMINO LOGIC CIRCUITS

(75) Inventors: Volkan Kursun, Rochester, NY (US); Eby G. Friedman, Rochester, NY (US)

(73) Assignee: University of Rochester, Rochester, NY (US)

( * ) Notice: Subject to any disclaimer, the term of this patent is extended or adjusted under 35 U.S.C. 154(b) by 66 days.

(21) Appl. No.: 10/411,375

(22) Filed: Apr. 11, 2003

(65) Prior Publication Data

US 2004/0008056 A1 Jan. 15, 2004

Related U.S. Application Data

(60) Provisional application No. 60/371,732, filed on Apr. 12, 2002.

(51) Int. Cl.[7] .............................................. H03K 19/096
(52) U.S. Cl. ........................................ 326/95; 326/121
(58) Field of Search .............................. 326/93, 95, 98, 326/121; 327/544

(56) References Cited

U.S. PATENT DOCUMENTS

| 5,973,541 | A | | 10/1999 | Rajivan et al. ............. 327/374 |
|---|---|---|---|---|
| 6,049,231 | A | | 4/2000 | Bosshart ...................... 326/98 |
| 6,429,689 | B1 | * | 8/2002 | Allen et al. .................... 326/95 |
| 6,522,171 | B2 | * | 2/2003 | Hanson et al. ................ 326/95 |
| 6,580,293 | B1 | * | 6/2003 | Bernstein et al. ............. 326/95 |

OTHER PUBLICATIONS

Alvandpour et al., A Low–Leakage Dynamic Multi–Ported Register File in 0.13 μm CMOS, ISLPED '01, Aug. 6–7, 2001, Huntington Beach, California, © 2001 ACM, pp. 68–71.

Tschanz et al.,Effectiveness of Adaptive Supply Voltage and Body Bias for Reducing Impact of Parameter Varitations in Low Power and High Performance Microprocessors, 2002 Symposium on VLSI Circuits Digest of Technical Papers, © 2002, IEEE, pp. 310–311.

Keshavarzi et al., Technology Scaling Behavior of Optimum Reverse Body Bias for Standby Leakage Power Reduction in CMOS IC's, ISLPED '99, San Diego, California, © 1999, ACM, pp. 252–254.

Keshavarzi et al., Forward Body Bias for Microprocessors in 130nm Technology Generation and Beyond, 2002 Symposium on VLSI Circuits Digest of Technical Papers, © 2002 IEEE, pp. 312–315.

Wann et al., CMOS with Active Well Bias for Low–Power and FR/Analog Applications, 2000 Symposium on VLSI Technology Digest of Technical Papers, © 2000, IEEE, pp. 158–159.

Huang et al., Scalability and Biasing Strategy for CMOS with Active Well Bias, 2001 Symposium on VLSI Technology Digest of Technical Papers, pp. 107–108 , 2001.

Alvandpour et al., A Sub–130–nm Conditional Keeper Technique, IEEE Journal of Solid–State Circuits, vol. 37, No. 5, May 2002, pp. 633–638.

Nowka et al., Circuit Design Techniques for a Gigahertz Integer Microprocessor, proceedings of the IEEE International Conference on Computer Design, VLSI in Computers and Processors, pp. 11–16, Oct. 1998.

(Continued)

*Primary Examiner*—Daniel D. Chang
(74) *Attorney, Agent, or Firm*—Blank Rome LLP

(57) ABSTRACT

A domino logic circuit is configured to reduce power consumption. In a first embodiment, a sleep switch grounds the dynamic node during sleep mode. In a second embodiment, a low-swing circuit at the output reduces the output and keeper transistor gate voltage swings. A third embodiment combines those two techniques.

20 Claims, 16 Drawing Sheets

OTHER PUBLICATIONS

Kursun et al., Low Swing Dual Threshold Voltage Domino Logic, Proceedings of the ACM/SIGDA Great Lakes Symposium on VLSI, Apr. 2002, pp. 47–52.

Hwang et al., Ultrafast Compact 32–bit CMOS Adders in Multiple–Output Domino Logic, IEEE Journal of Solid–State Circuits, vol., 24, No. 2, Apr., 1989, pp. 358–369.

Allam et al., High–Speed Dynamic Logic Styles for Scaled–Down CMOS and MTCMOS Technologies, Proceedings of the IEEE International Symposium on Low Power Electronics and Design, Jul., 2000, pp. 155–160.

Alvandpour et al., A Leakage–Tolerant Multi–Phase Keeper for Wide Domino Circuits, © 1999 IEEE, pp. 209–212.

* cited by examiner

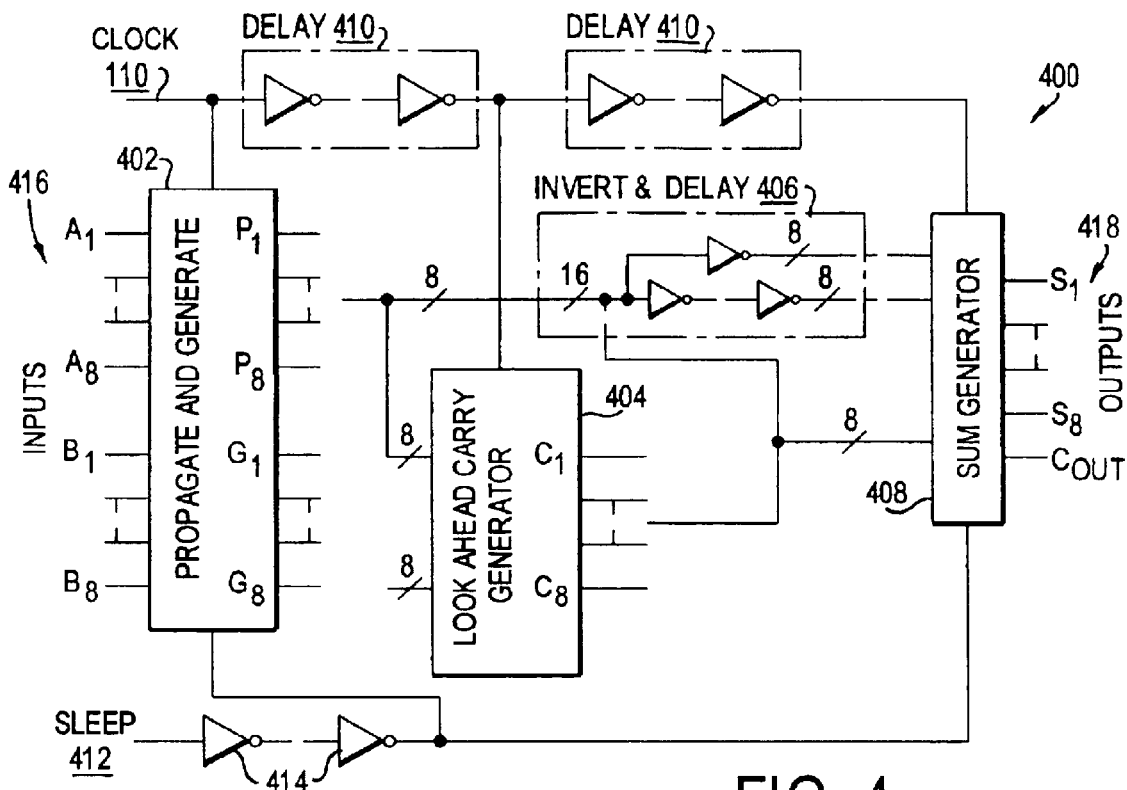
FIG. 4
FIG. 5
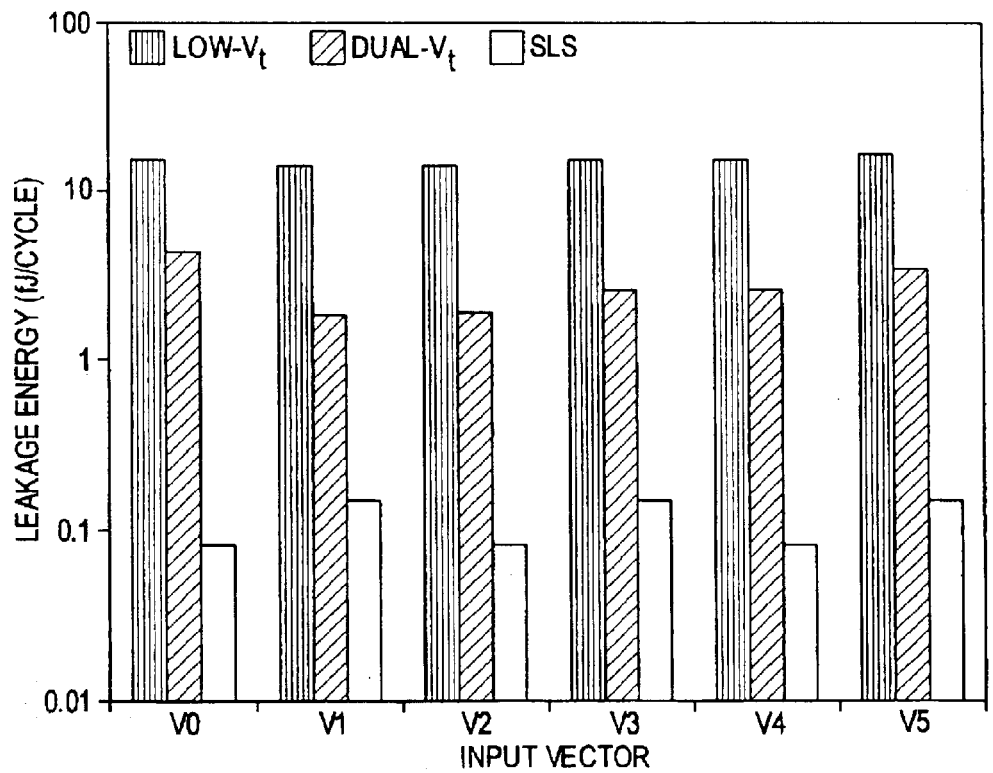

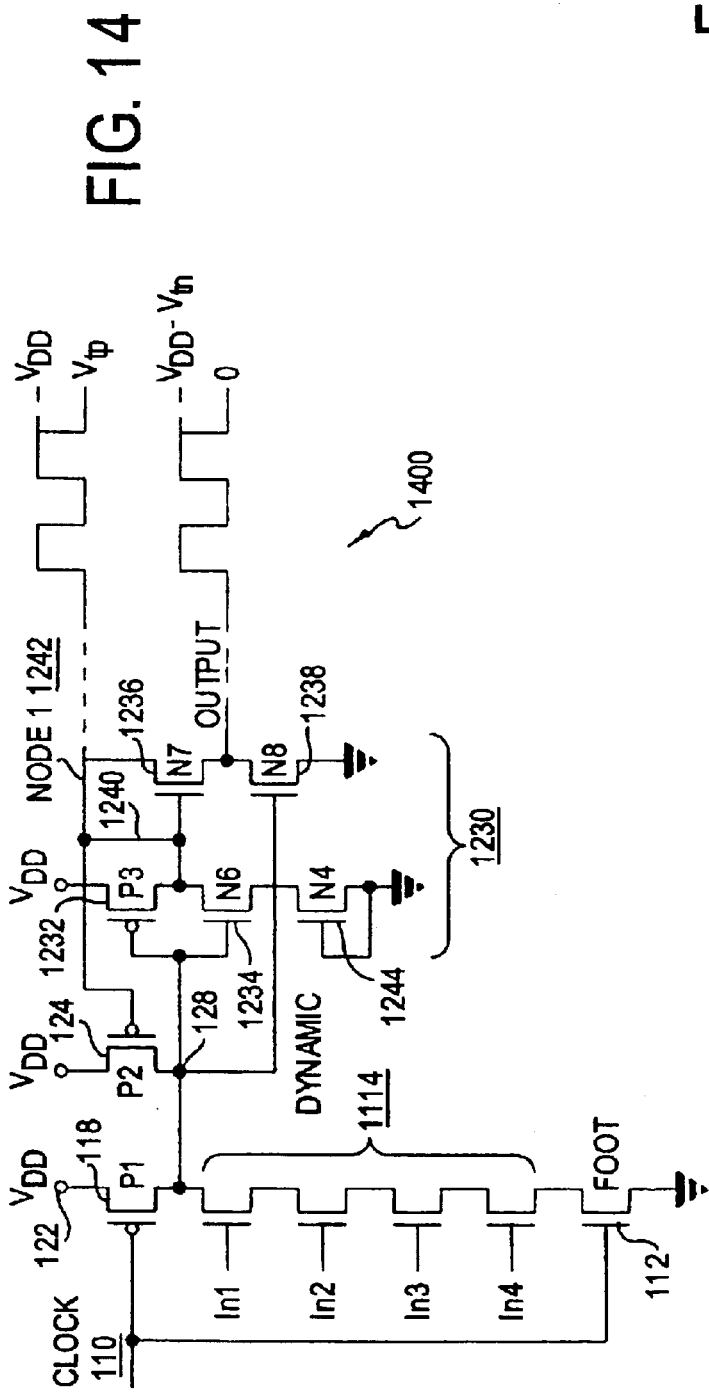

DUAL THRESHOLD VOLTAGE AND LOW SWING DOMINO LOGIC CIRCUITS

REFERENCE TO RELATED APPLICATION

The present application claims the benefit of U.S. Provisional Application No. 60/371,732, filed Apr. 12, 2002, whose disclosure is hereby incorporated by reference in its entirety into the present disclosure.

STATEMENT OF GOVERNMENT INTEREST

The research leading to the present invention was supported in part by DARPA/ITO under AFRL Contract F29601-00-K-0182. The government has certain rights in the present invention.

FIELD OF THE INVENTION

The present invention is directed to domino logic circuits and in particular to domino logic circuits with reduced power consumption during sleep (standby) mode.

DESCRIPTION OF RELATED ART

The power consumed in high performance microprocessors has increased to levels that impose a fundamental limitation on continuing the historical trends of increasing performance and functionality. If the current trend in the increase in the power levels continues, high performance microprocessors will consume thousands of watts in the near future. The power density of a high performance microprocessor will exceed the power density levels encountered in typical rocket nozzles within the next decade. The generation, distribution, and dissipation of power are now at the forefront of the current problems faced by the integrated circuit industry.

Dynamic switching power, the dominant component of the total power consumed in current CMOS technologies, is quadratically reduced by lowering the supply voltage. Lowering the supply voltage, however, also degrades the circuit speed due to the reduced transistor currents. The threshold voltages are scaled in order to reduce the degradation in speed caused by supply voltage scaling while maintaining the dynamic power consumption within acceptable levels. At reduced threshold voltages, however, subthreshold leakage currents increase exponentially. The subthreshold leakage power is expected to dominate the total power consumption of a CMOS circuit in the near future. Energy efficient circuit techniques aimed at lowering the leakage currents are, therefore, highly desirable.

Domino logic circuit techniques are extensively applied in high performance microprocessors due to the superior speed and area characteristics of domino CMOS circuits as compared to static CMOS circuits. A dual threshold voltage (dual-$V_t$) circuit technique was proposed in J. Kao, "Dual Threshold Voltage Domino Logic," *Proceedings of the European Solid-State Circuits Conference*, pp. 118–121, September 1999 (hereafter cited as "Kao") for reducing the subthreshold leakage of domino logic circuits. The technique proposed by Kao utilizes a mix of high and low threshold voltage transistors. High threshold voltage (high-$V_t$) transistors are employed on the non-critical precharge paths. Alternatively, low threshold voltage (low-$V_t$) transistors are employed on speed critical evaluation paths. Gating all of the inputs of the first stage domino circuits in a domino pipeline is proposed to force the idle domino gates into a low leakage state.

The energy and delay overheads for entering and leaving the sleep mode with the proposed technique, however, have not been addressed by Kao. Significant dynamic switching energy is consumed for activating the sleep mode with the technique proposed by Kao (due to the additional gates at the inputs). Additional energy is dissipated to precharge all of the dynamic nodes while reactivating a domino logic circuit at the end of an idle period. In order to justify the use of additional circuitry to place a dual-$V_t$ circuit into a low leakage state, the total energy consumed for entering and leaving the standby mode must be significantly less than the savings in the standby leakage. Gating all of the inputs of the first stage of a domino circuit in a domino pipeline also increases the circuit area and active mode power. Furthermore, circuit performance during the active mode is degraded due to the additional gates at the inputs. A circuit technique with low delay and energy overheads for placing a dual-$V_t$ domino logic circuit into a low leakage state is, therefore, desirable.

Employing dual threshold voltage (dual-$V_t$) transistors for leakage reduction in domino logic circuits was first proposed by Kao. Low-$V_t$ and dual-$V_t$ carry propagator (P) and generator (G) circuits of a domino carry look ahead adder are shown in FIGS. 1A–1D. The low-$V_t$ domino generator (G) 102 of FIG. 1A, the dual-$V_t$ domino generator (G) 104 of FIG. 1B, the low-$V_t$ domino carry propagator (P) 106 of FIG. 1C and the dual-$V_t$ domino carry propagator (P) 108 of FIG. 1D each include a clock signal input 110, a foot 112 connected to ground, a pulldown transistor network section 114 or 116, a pullup 118 or 120 connected to a voltage source (VDD) 122, a keeper 124 or 126 connected to a dynamic node 128, and a two-transistor output section 130 or 132.

The high-$V_t$ transistors are represented in FIGS. 1A–1D (and throughout the drawings) by a bold line in the channel region. The critical signal transitions that determine the delay of a domino logic circuit occur along the evaluation path. Therefore, in a dual-$V_t$ domino circuit, all of the transistors that can switch during the evaluation phase (other than the keeper) have a low-$V_t$. Alternatively, the precharge phase transitions are not critical for the performance of a domino logic circuit. Therefore, those transistors that are active during the precharge phase have a high-$V_t$.

If all of the high-$V_t$ transistors are cutoff in a dual-$V_t$ domino logic circuit, the leakage current is significantly reduced as compared to a low-$V_t$ circuit. The clock is gated high, cutting off the high-$V_t$ pullup transistors when a domino logic circuit is idle. In a standard dual-$V_t$ domino logic circuit, the modes of operation of the remaining portion of the high-$V_t$ transistors (other than the pullup transistor) are determined by the input vectors applied after the clock is gated high.

Subthreshold leakage current exponentially decreases with increasing threshold voltage. The leakage current of a cutoff high-$V_t$ transistor is significantly lower as compared to a low-$V_t$ transistor. The leakage currents in a dual-$V_t$ circuit can be reduced by employing a greater number of high-$V_t$ transistors. Unless all of the high-$V_t$ transistors are strongly cutoff, the potential savings in energy by a dual-$V_t$ domino circuit technique cannot be fully exploited (as compared to a low-$V_t$ domino circuit). Circuit techniques to place a domino logic circuit into a low leakage state regardless of the input vectors and the initial voltage states of the circuit nodes (before the gating of the clock) are desirable. Dual-$V_t$ domino logic circuit techniques with different standby control mechanisms have been proposed in the literature.

A dual-$V_t$ circuit technique was proposed by Kao for reducing the leakage current in domino pipelines. The dual-$V_t$ circuit technique described by Kao requires the input signal of the first stage in each domino pipeline to be gated. After forcing the first stage of the domino gates to evaluate, the domino gates of the following stages in the pipeline also evaluate in a domino fashion. The technique proposed by Kao, however, is ineffective to place a circuit into a low leakage state if some of the domino gates in a cascaded domino logic circuit requires inverted signals (such as an XOR domino gate generating a sum bit at the output stage of a domino adder). Most domino logic circuits cannot be placed into a minimum leakage state (in which all of the high-$V_t$ transistors are strongly cutoff) simply by gating the input vectors of the first stage gates of a domino circuit. The technique proposed by Kao also requires significant dynamic switching energy overhead for activating the sleep mode (due to the additional gates at the inputs). The dual-$V_t$ domino circuit proposed by Kao, therefore, offers energy savings only if the circuit stays idle for a long time. Furthermore, gating all of the inputs of the first stage of a domino circuit in a domino pipeline increases the circuit area and active mode power. Circuit performance during the active mode is also degraded due to the additional gates at the inputs.

An alternative dual-$V_t$ technique has been proposed (M. W. Allam, M. H. Anis, and M. I. Elmasry, "High-Speed Dynamic Logic Styles for Scaled-Down CMOS and MTC-MOS Technologies," *Proceedings of the IEEE International Symposium on Low Power Electronics and Design*, pp. 155–160, July, 2000) to reduce the dynamic power, delay, and area overhead as compared to the technique proposed in Kao. Although the delay and area overhead is reduced, standby leakage energy is higher as compared to the circuit proposed in Kao. This increased leakage energy is primarily because the NMOS transistor inside the output inverter of the first stage domino gate in each domino pipeline is not fully turned off and because the keeper has a low-$V_t$.

Utilizing the leakage currents of the pulldown path transistors has been proposed (S. Heo and K. Asanovic, "Leakage-Biased Dormino Circuits for Dynamic Fine-Grain Leakage Reduction," *Proceedings of the IEEE International Symposium on VLSI Circuits*, pp. 316–319, June, 2002) for placing a dual-$V_t$ domino logic circuit into a low leakage state. High-$V_t$ switches are employed in series with the keeper and the NMOS transistor of the output inverter in a domino circuit. When the circuit is active, these high-$V_t$ switches are on and the circuit operates similar to a standard dual-$V_t$ circuit. When the circuit is idle, the high-$V_t$ series switches are cutoff by a sleep signal, isolating the dynamic node from the power supply. The floating dynamic node slowly discharges due to the leakage current of the pulldown path transistors. The high-$V_t$ switch in series with the NMOS transistor of the output inverter ensures that no short-circuit power is consumed during the slow discharge of the dynamic node. A high-$V_t$ series transistor at the output inverter, however, degrades the precharge delay. Furthermore, a high-$V_t$ transistor in series with a keeper degrades the noise immunity. To minimize the degradation in noise immunity and precharge delay, the size of these series switches needs to be increased. Wider series transistors, however, increase the energy overhead of activating the standby leakage control mechanism. Increasing the series transistor size also increases the area overhead of this technique. Another disadvantage of this technique is the slow speed of the proposed mechanism for placing a circuit into a low leakage state. The circuit technique, therefore, may not be feasible for fine-grain leakage reduction during short idle periods (a few tens to hundreds of clock cycles) in high performance integrated circuits.

SUMMARY OF THE INVENTION

It will be readily apparent that a need exists in the art to overcome the above difficulties of the prior art.

To achieve the above and other objects, the present invention, in one embodiment, is directed to a circuit technique for lowering the standby leakage energy of a domino logic circuit. The proposed circuit technique employs sleep switch transistors and a dual threshold voltage transistor distribution for placing a domino logic circuit into a low leakage state. An eight bit domino carry look ahead adder has been designed based on the proposed circuit technique. The proposed circuit technique reduces the leakage energy by up to 207 times as compared to a standard low threshold voltage domino circuit. With the proposed sleep switch circuit technique, the delay penalty for placing a circuit into a low leakage state is minimal. With the sleep switch circuit technique, a dual threshold voltage domino adder enters and leaves the sleep mode within a single clock cycle. The proposed circuit technique strongly turns off all of the high-$V_t$ transistors and thereby exploits the full potential effectiveness of employing dual-$V_t$ transistors to reduce the subthreshold leakage current. The proposed circuit technique, therefore, reduces the subthreshold leakage energy by up to 58 times as compared to a standard dual-$V_t$ domino logic circuit. The energy overhead of the proposed sleep switch technique is low, permitting the proposed technique to be activated during idle periods as short as 381 clock cycles so as to reduce the standby leakage energy.

A low swing domino logic circuit technique is also proposed in another embodiment to lower the dynamic switching energy consumption of domino logic circuits operating in the active mode. The low swing concept is also applied to the domino circuit keeper to further reduce the power consumption while enhancing speed.

The sleep switch circuit technique reduces the leakage energy by up to 207 times as compared to a standard low-$V_t$ circuit. The proposed circuit technique also reduces the active mode delay and power by up to 32% and 14%, respectively, as compared to a low-$V_t$ circuit.

The proposed circuit technique strongly turns off all of the high-$V_t$ transistors and thereby exploits the full potential effectiveness of employing dual-$V_t$ transistors to reduce leakage. The sleep switch circuit technique reduces the leakage energy by up to 58 times as compared to a standard dual-$V_t$ circuit. The energy overhead of the proposed sleep switch technique is low, justifying the use of the proposed technique during idle periods as short as 381 clock cycles in order to reduce standby leakage energy.

Low swing domino logic circuits with weakly driven keepers and fully driven keepers are proposed for power savings during the active mode of operation. The proposed low swing domino logic circuits can significantly reduce the active mode dynamic switching power consumption without degrading the noise immunity. The proposed low swing domino logic circuits with fully driven keeper lower active mode dynamic switching power by up to 9.4% and tolerate up to 2.6% more noise as compared to standard domino. The active power is further reduced by weakening the keeper which also improves the evaluation delay due to reduced contention current. The proposed low swing domino logic circuits with weakly driven keeper reduce the active mode dynamic switching power consumption by up to 12.4% as compared to standard domino logic circuits.

The standard dual-$V_t$ domino logic circuit technique without sleep switches (prior art) is referred to as a no-sleep dual-$V_t$ domino. The proposed sleep switch dual-$V_t$ circuit technique (first preferred embodiment of the present invention) is referred to as SLS.

BRIEF DESCRIPTION OF THE DRAWINGS

Preferred embodiments of the present invention will be set forth in detail with reference to the drawings, in which:

FIG. 4 shows a block diagram of a clock-delayed domino carry look ahead adder according to the first preferred embodiment;

FIG. 5 is a graph showing a comparison of the leakage energy (per cycle) of the adder circuits with the low-$V_t$, no-sleep dual-$V_t$, and SLS circuit techniques for six different input vectors;

FIG. 14 shows a circuit diagram of a four-input AND gate based on the circuit of FIG. 12;

FIG. 15 shows a schematic diagram of a three-stage pipeline used to test the concepts of the second preferred embodiment;

DETAILED DESCRIPTION OF THE PREFERRED EMBODIMENTS

Figure 1A:
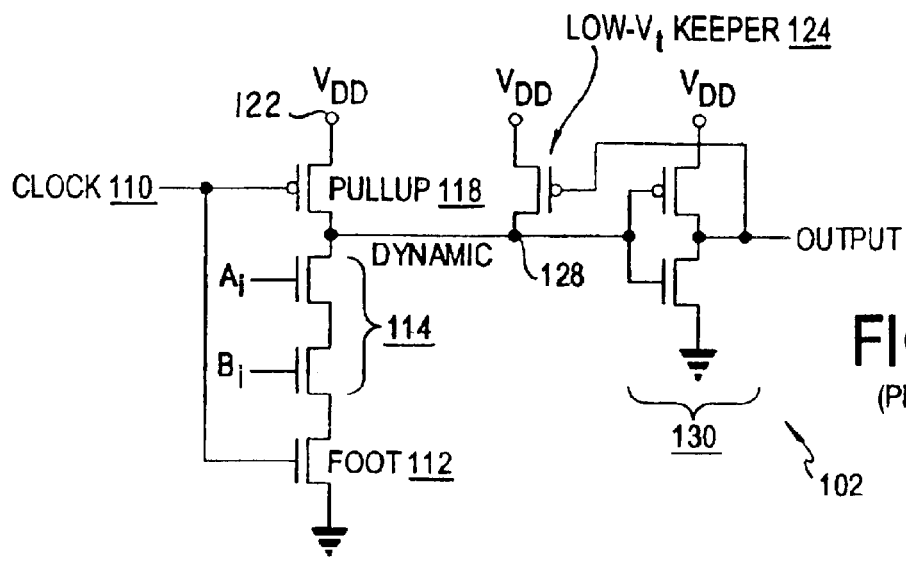
FIGS. 1A–1D show circuit diagrams of domino cells for a carry look ahead adder according to the prior art, specifically, a low-Vt domino generator, a dual-Vt domino generator, a low-Vt domino carry propagator, and a dual-Vt domino carry propagator, respectively.
Figure 1B:
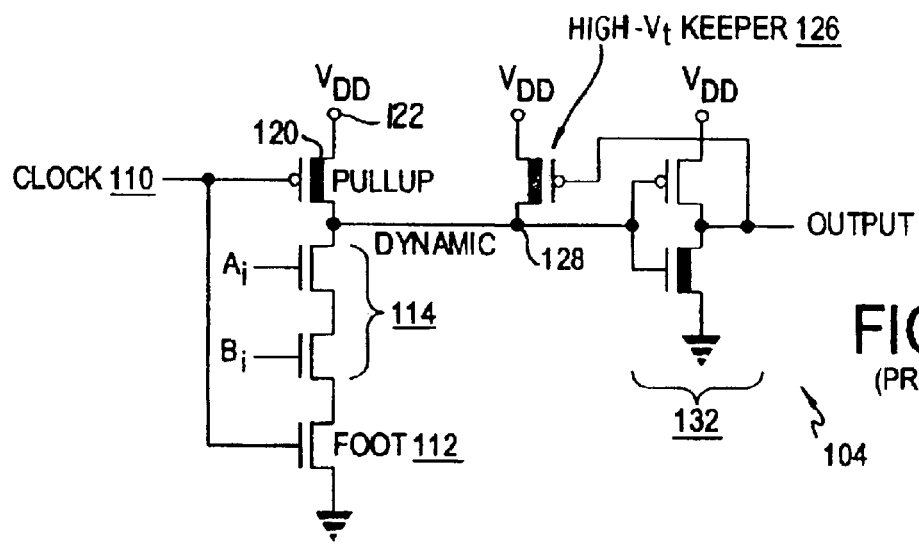
Figure 1C:
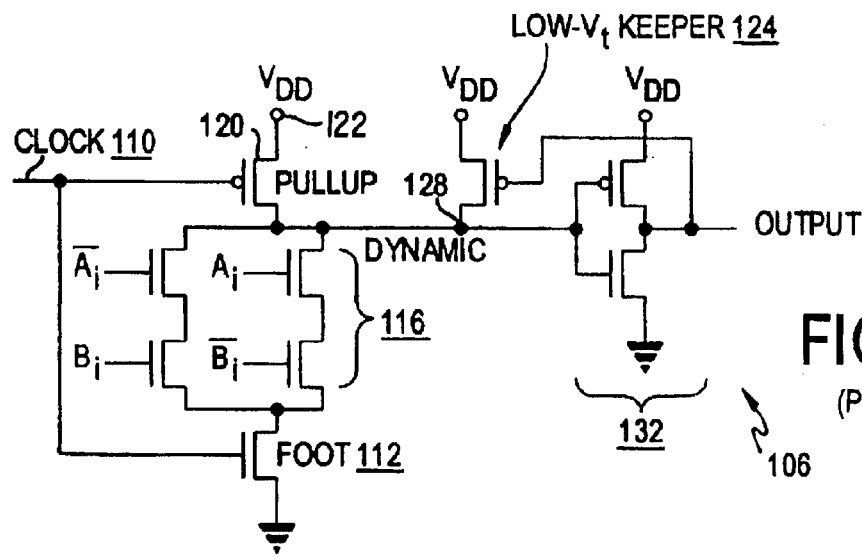
Figure 1D:
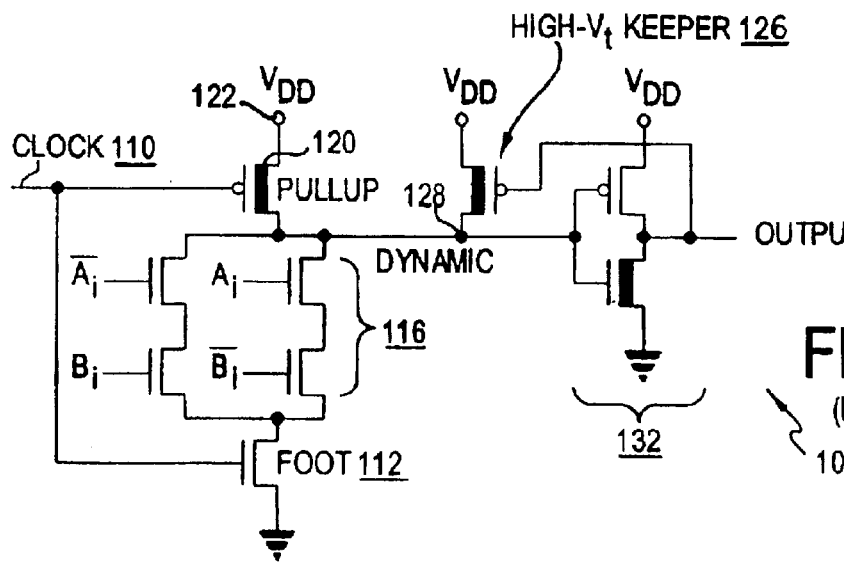

Preferred embodiments of the present invention will be set forth in detail with reference to the drawings, in which like reference numerals refer to like elements throughout.

In the first preferred embodiment, a low energy and delay overhead circuit technique is proposed to lower the subthreshold leakage currents in an idle domino logic circuit. The proposed circuit technique employs sleep switches to place a dual-$V_t$ domino logic circuit into a low leakage state within a single clock cycle. Generic domino logic gates based on the standard dual-$V_t$ domino logic circuit technique are shown in FIGS. 2A–2F. Generic domino logic gates based on the proposed sleep switch dual-$V_t$ (SLS) domino logic circuit technique are shown in FIGS. 19A–19F and 20A–20F. The generator and carry propagator gates of a domino carry look ahead adder based on the proposed SLS circuit technique are shown in FIGS. 3A and 3B.

Figure 2A:
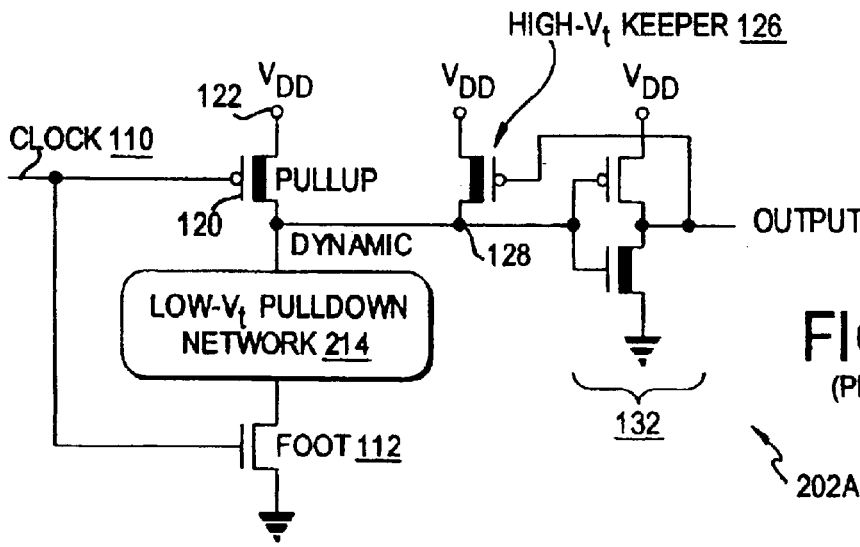
FIGS. 2A–2F show circuit diagrams of dual-Vt generic logic gates according to the prior art.
Figure 3A:
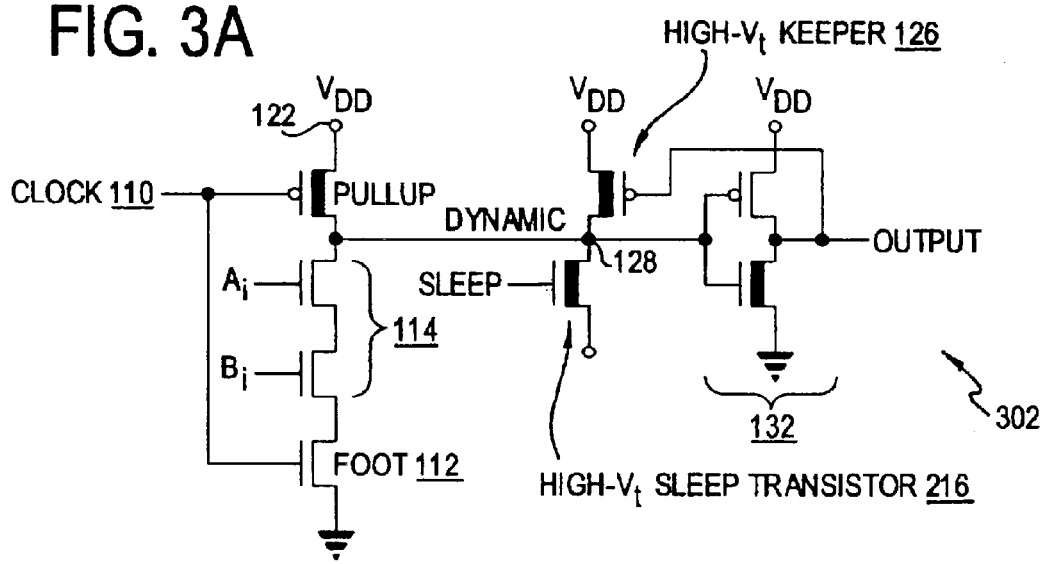
FIGS. 3A and 3B show circuit diagrams of carry look ahead adders according to the first preferred embodiment, implemented as a generator and a carry propagator, respectively.
Figure 3B:
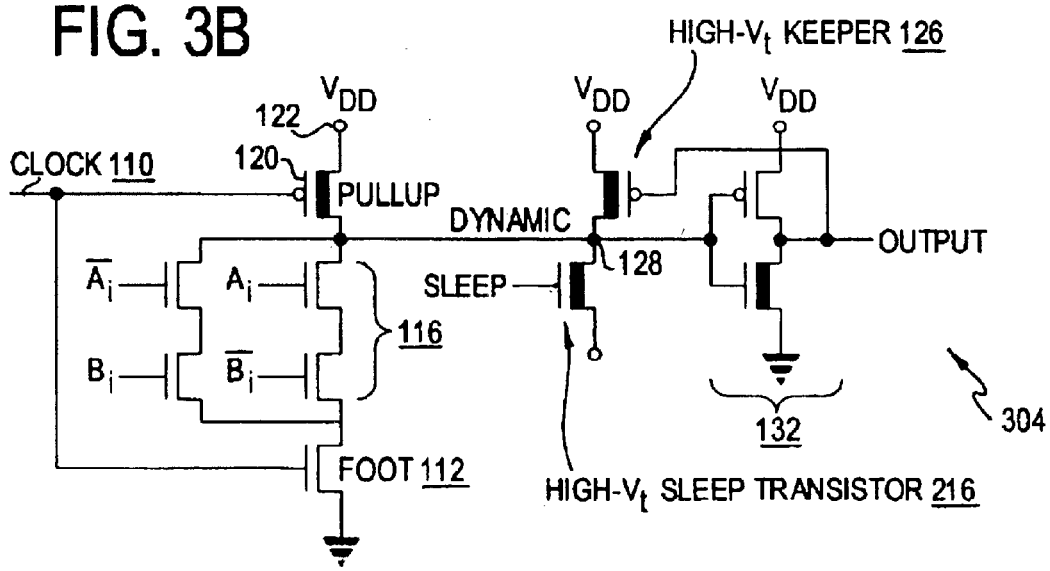
Figure 19A:
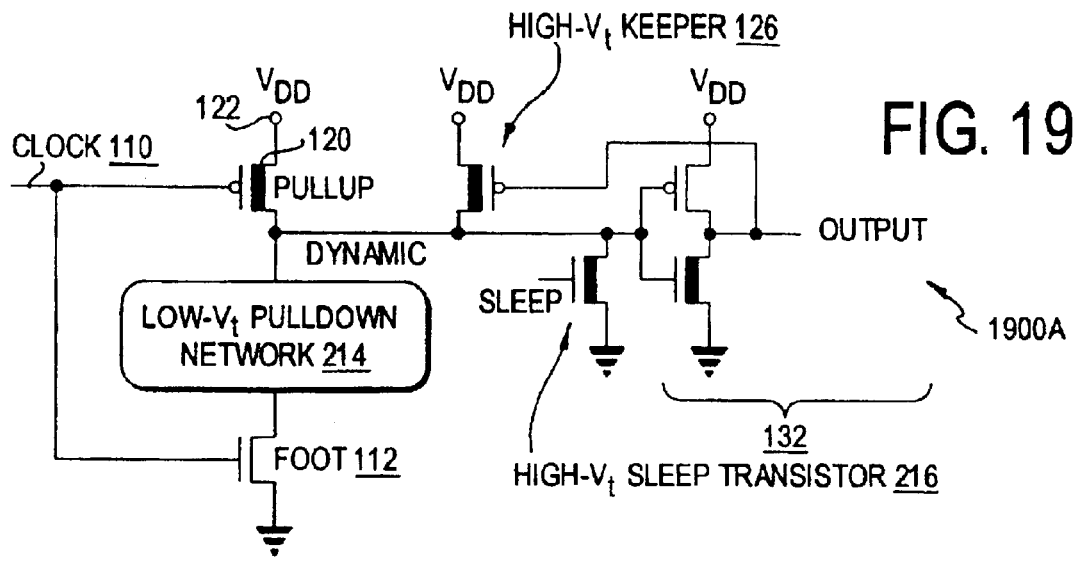
FIGS. 19A–19F show high-$V_t$ sleep switch domino logic circuits based on the circuits of FIGS. 2A–2F, except modified according to the first preferred embodiment.
Figure 19B:
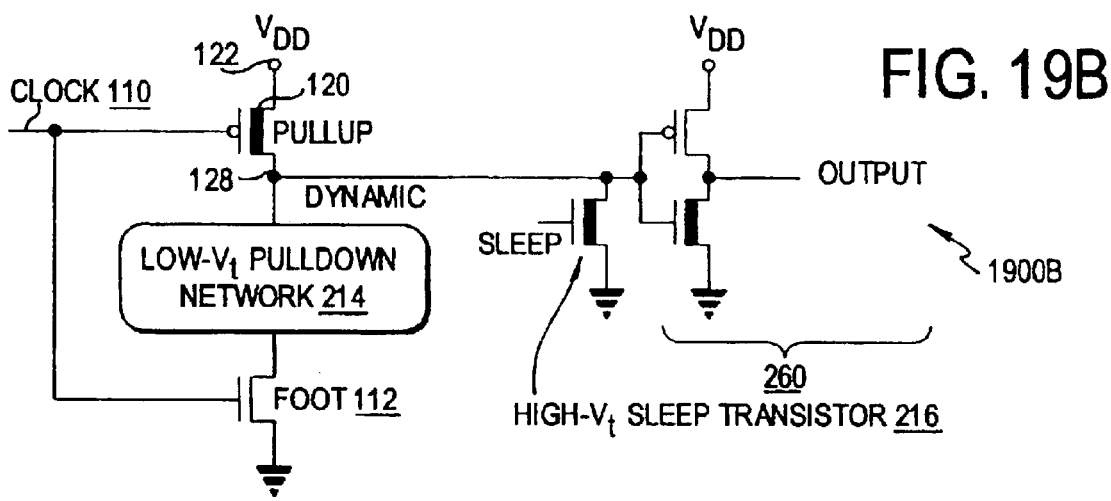
Figure 19C:
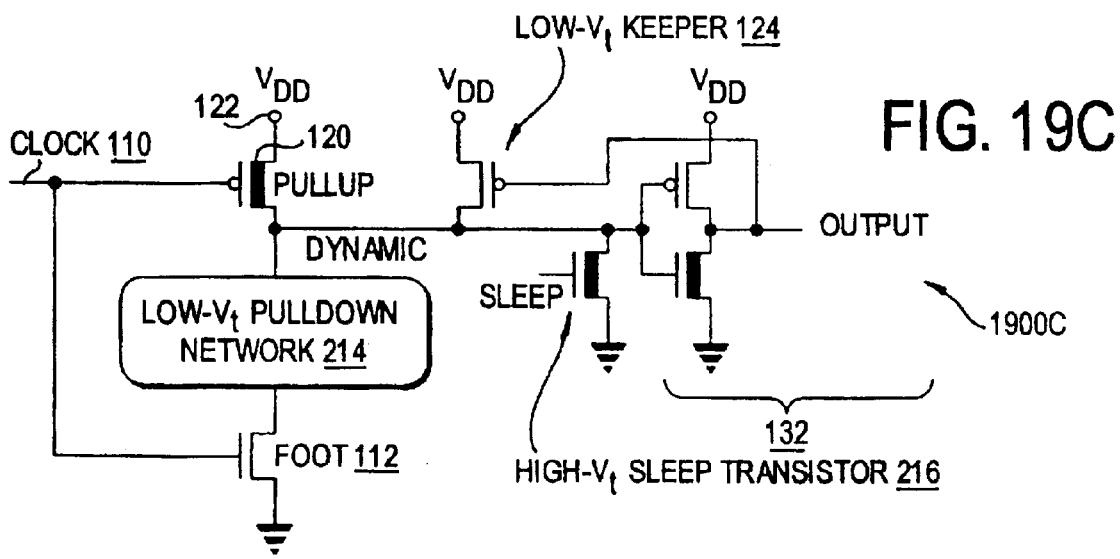
Figure 19D:
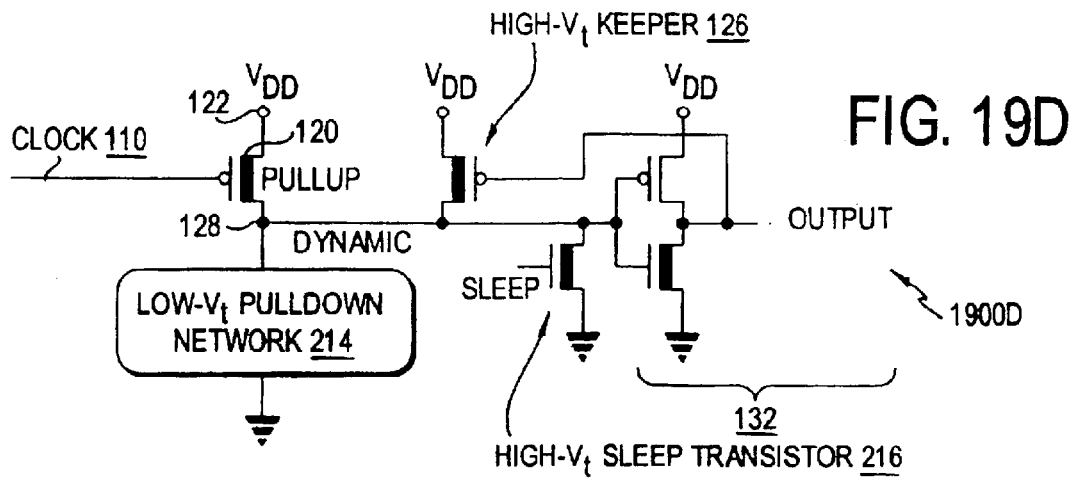
Figure 19E:
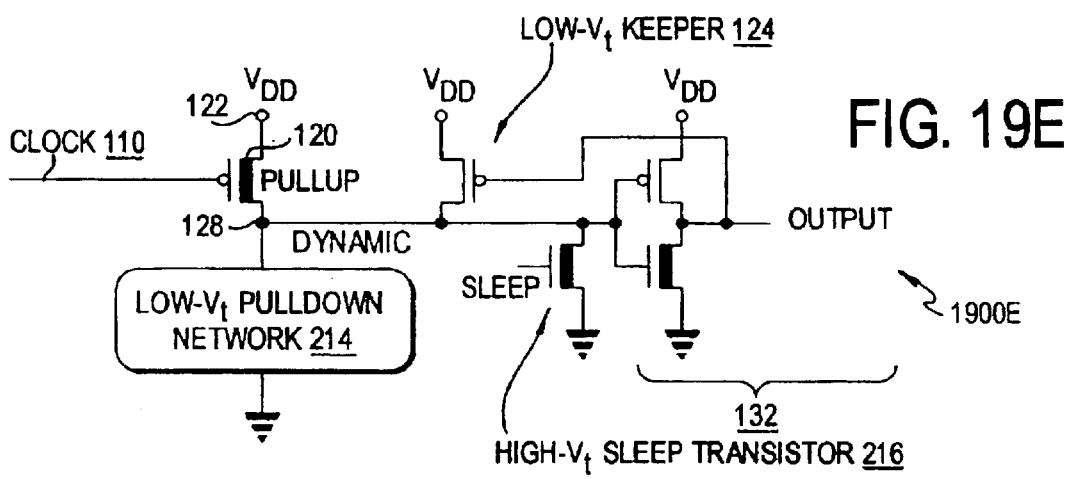
Figure 19F:
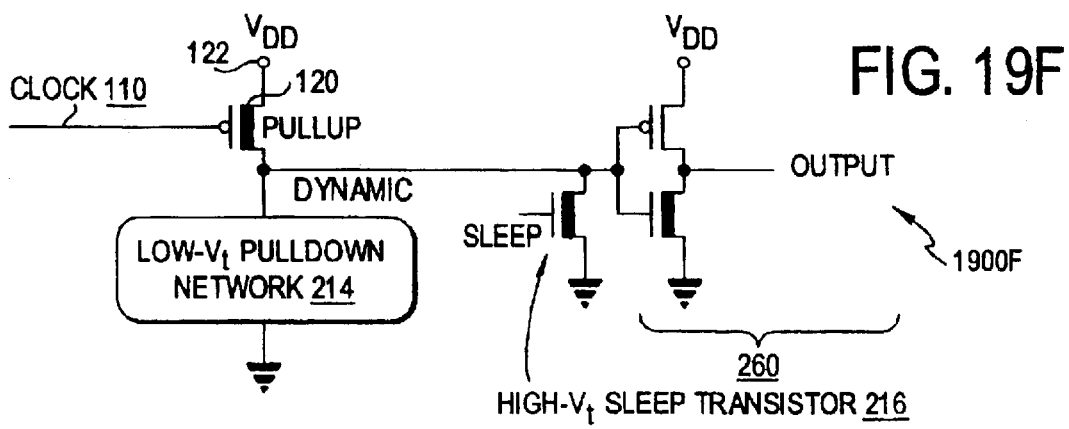
Figure 20A:
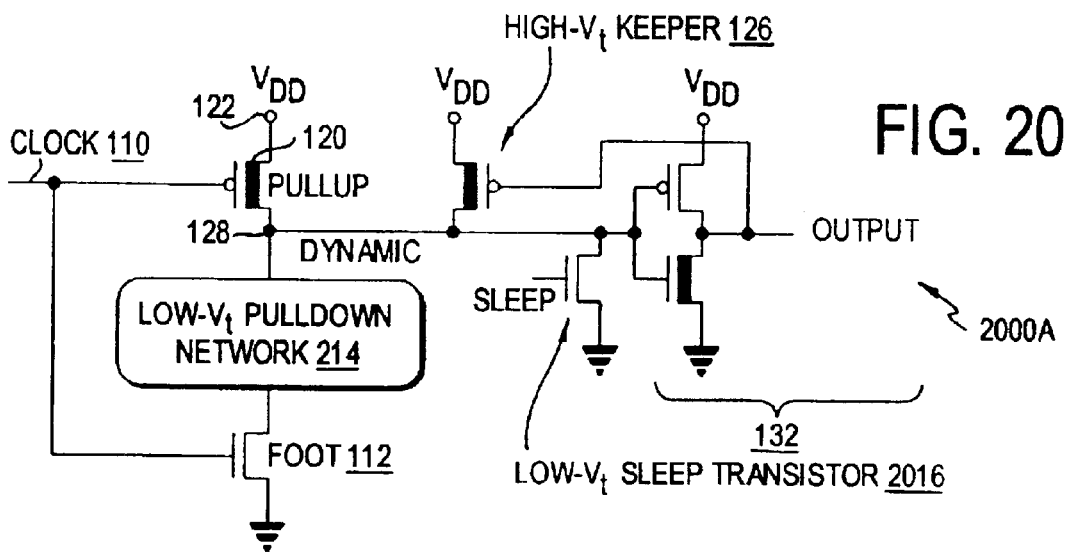
FIGS. 20A–20F show low-$V_t$ sleep switch domino logic circuits based on the circuits of FIGS. 2A–2F, except modified according to the first preferred embodiment.
Figure 20B:
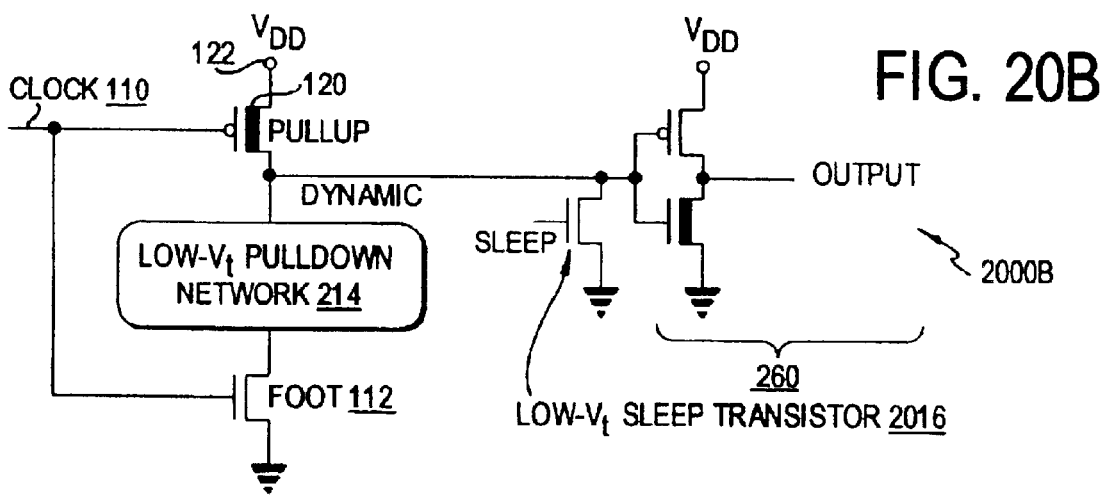
Figure 20C:
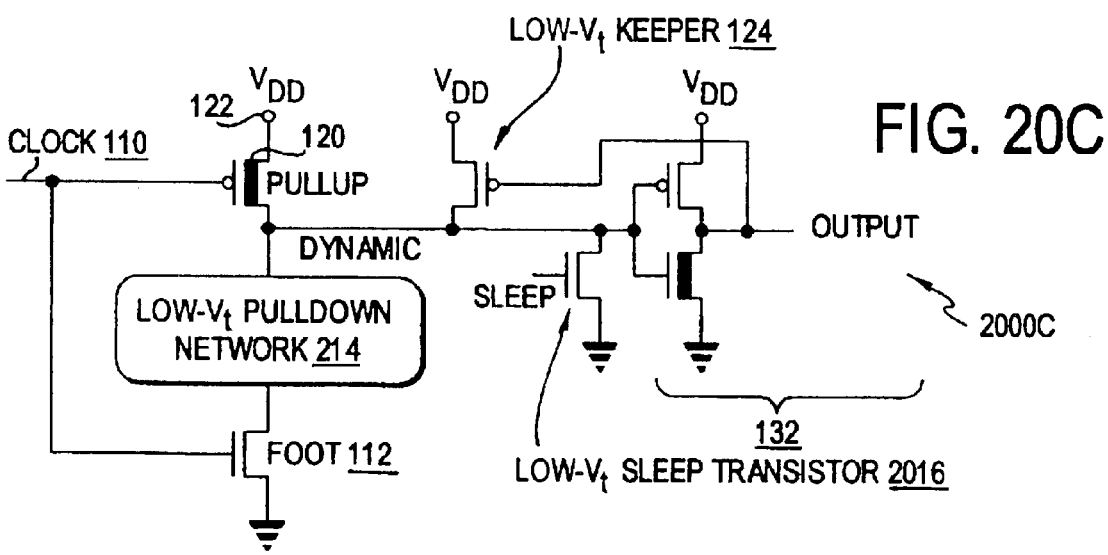
Figure 20D:
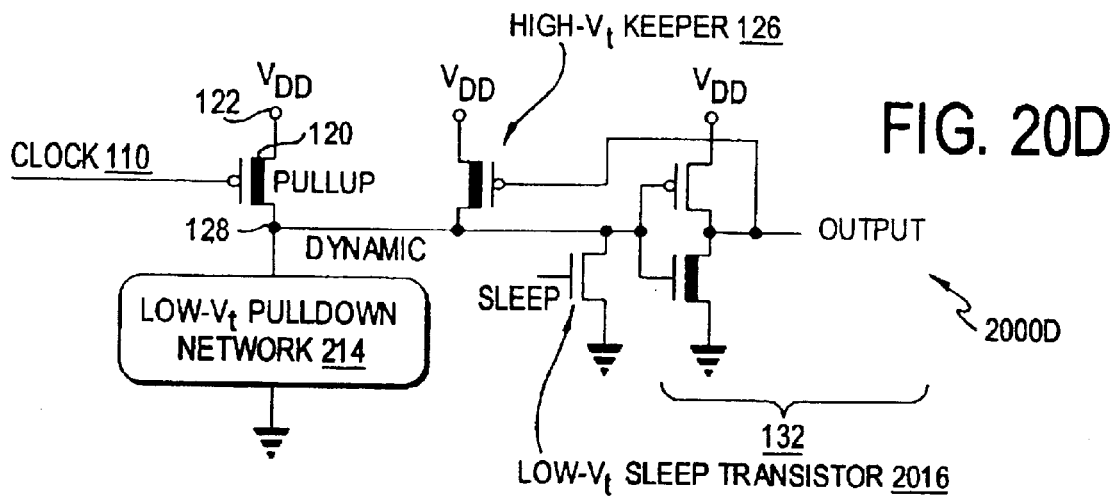
Figure 20E:
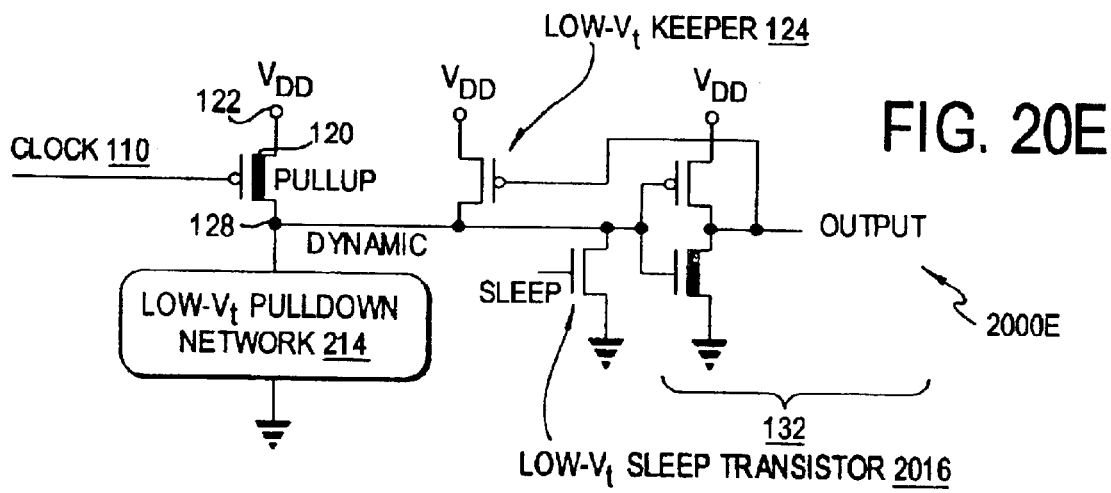
Figure 20F:
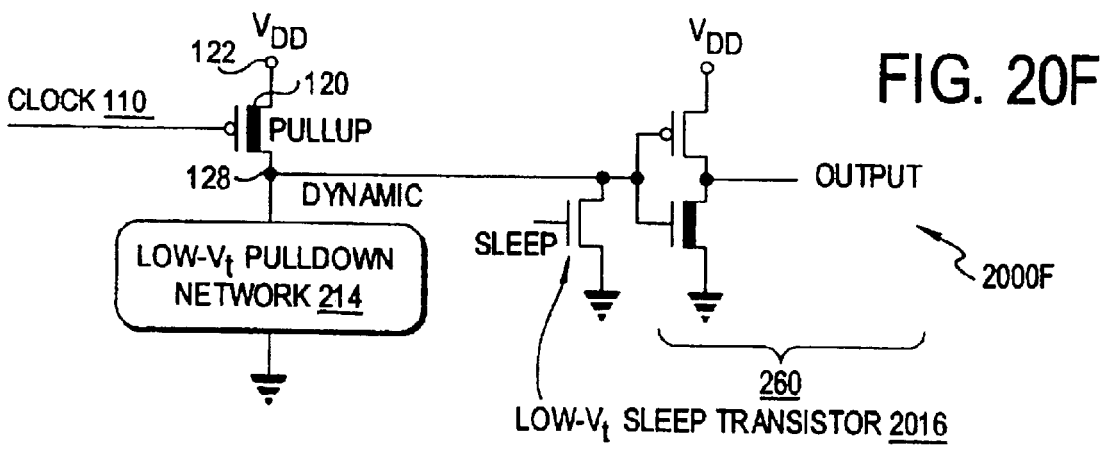

The generic circuit 202A of the prior art as shown in FIG. 2A and the generic circuit 1900A of the first preferred embodiment as shown in FIG. 19A have a low-$V_t$ pulldown network 214. However, the circuit 1900A of FIG. 19A differs from the circuit 202A of FIG. 2A in that a high-$V_t$ NMOS switch 216 (sleep transistor) is added to the dynamic node 128. The same switch is shown in the circuits 302 and 304 of FIGS. 3A and 3B. The operation of this transistor is controlled by a separate sleep signal. During the active mode of operation, the sleep signal is set low, the sleep switch is cut-off, and the proposed dual-$V_t$ circuit operates as a standard dual-$V_t$ domino circuit. During the standby mode of operation, the clock signal is maintained high, turning off the high-$V_t$ pull-up transistor of each domino gate. The sleep signal transitions high, turning on the sleep switch. The dynamic node of the domino gate is discharged through the sleep switch thereby turning off the high-$V_t$ NMOS transistor within the output inverter. The output transitions high, cutting off the high-$V_t$ keeper. After a sleep switch dual-$V_t$ domino gate is forced to evaluate, the following gates (fed by the non-inverting signals) also evaluate in a domino fashion. After the node voltages settle to a steady state, all of the high-$V_t$ transistors in a sleep switch domino logic circuit are strongly cut-off, thereby significantly reducing the subthreshold leakage current. Note that this technique, requiring no additional gating on the input signals while strongly turning off all of the high-$V_t$ transistors within a single clock cycle, is significantly more power, delay, and area efficient as compared to the techniques proposed in the prior art.

Figure 2B:
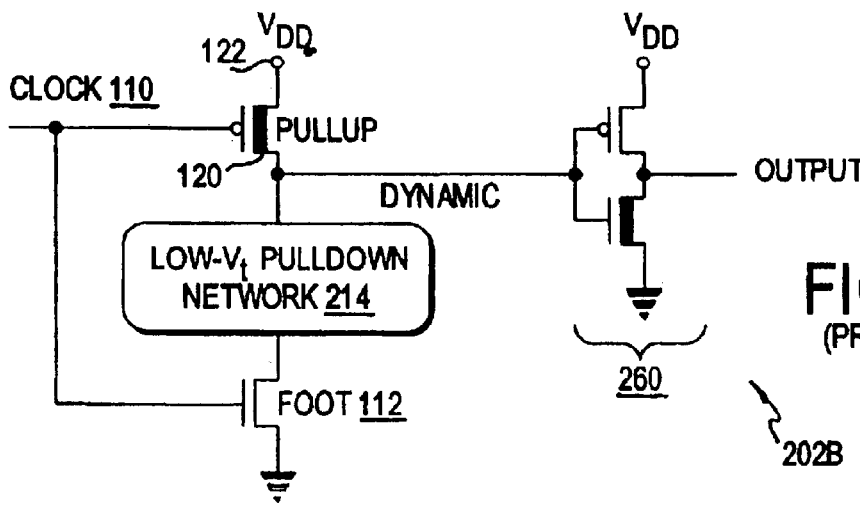

A keeper transistor opposes the evaluation of the inputs during the evaluation period. A keeper transistor, therefore, degrades the speed and power characteristics of a domino logic circuit. A domino logic circuit can be designed without a keeper transistor if the noise immunity is not a big concern. A generic standard dual-$V_t$ domino logic circuit 202B without a keeper transistor, but with a dual-$V_t$ output 260, is shown in FIG. 2B.

Figure 2C:
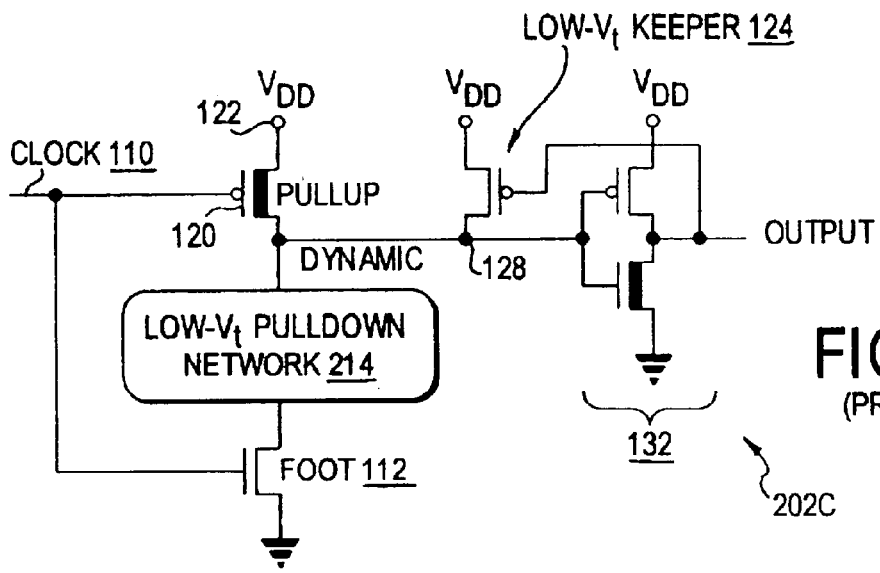

A high-$V_t$ keeper, as shown in FIG. 2A, is preferable to reduce the subthreshold leakage current. However, a high-$V_t$ keeper also degrades the noise immunity during the active mode of operation. For higher noise immunity, a domino logic circuit can be designed with a low-$V_t$ keeper transistor. A generic standard dual-$V_t$ domino logic circuit 202C with a low-$V_t$ keeper transistor is shown in FIG. 2C.

Figure 2D:
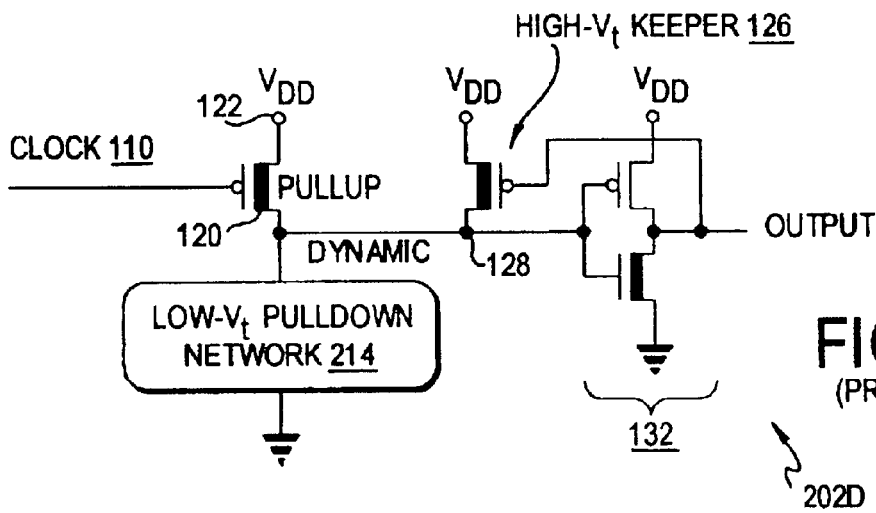
Figure 2E:
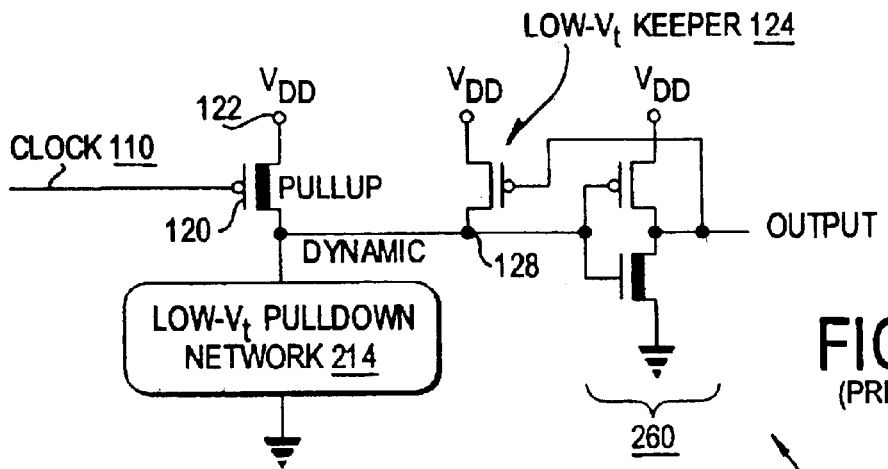
Figure 2F:
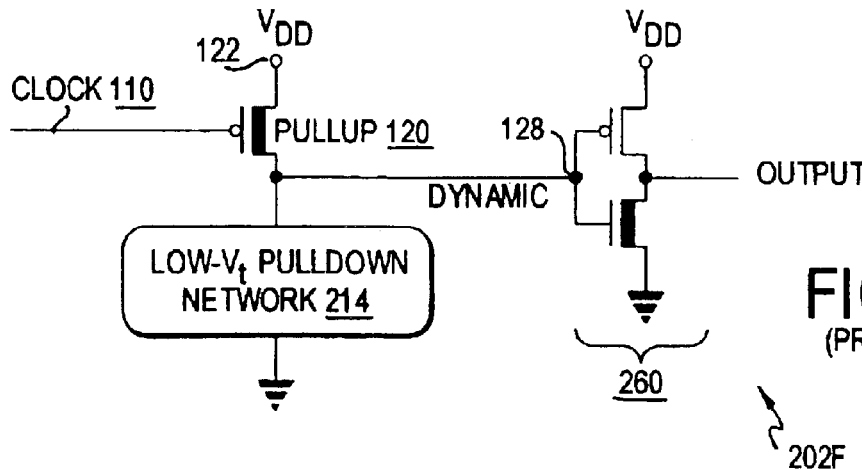

The foot transistor 112 is a series switch between the pulldown network and ground. The evaluation speed of a domino logic circuit is degraded due to the parasitic impedances of the foot transistor. A domino logic circuit can be designed without a foot transistor, provided that the timing of the clock and input signals are adjusted carefully. A generic standard dual-$V_t$ domino logic circuit 202D with a high-$V_t$ keeper and without a foot transistor is shown in FIG. 2D. A generic standard dual-$V_t$ domino logic circuit 202E with a low-$V_t$ keeper and without a foot transistor is shown in FIG. 2E. A generic standard dual-$V_t$ domino logic circuit 202F without a keeper and a foot transistor is shown in FIG. 2F.

Any of the circuits of FIGS. 2A–2F can be modified in accordance with the first preferred embodiment of the present invention to include a high-$V_t$ sleep transistor 216. The modifications of the circuits 202B–202F are shown in FIGS. 19B–19F as 1900B–1900F. The comments above concerning the circuit 1900A of FIG. 19A apply mutatis mutandis to the circuits 1900B–1900F of FIGS. 19B–19F.

An alternative version of the proposed sleep switch dual-$V_t$ circuit technique is also proposed. In this alternative version, the sleep transistor has a low threshold voltage. Note that this alternative circuit reduces the time it takes to enter the sleep mode, since the low-$V_t$ sleep transistor discharges the dynamic node faster as compared to a high-$V_t$ sleep transistor (assuming the low-$V_t$ and the high-$V_t$ sleep transistors have similar physical size). Generic domino logic gates based on the proposed sleep switch dual-$V_t$ (SLS) domino logic circuit technique with low-$V_t$ sleep switches are shown in FIGS. 20A–20F as 2000A–2000F, in which the low-$V_t$ sleep transistor is shown as 2016.

Any of the circuits of FIGS. 2A–2F can be modified in accordance with the first preferred embodiment of the present invention to include a low-$V_t$ sleep transistor 2016. The modifications of the circuits 202B–202F are shown in FIGS. 20B–20F as 2000B–2000F. The comments above concerning the circuits 1900A–1900F of FIGS. 19A–19F apply mutatis mutandis to the circuits 2000A–2000F of FIGS. 20A–20F.

Eight input clock-delayed domino carry look ahead adders based on the low-$V_t$, no-sleep dual-$V_t$, and SLS circuit techniques have been evaluated assuming a 0.18 μm CMOS technology ($V_{tnlow}=|V_{tplow}|=200$ mV, $V_{tnhigh}=|V_{tphigh}|=500$ mV, and T=110° C.). The standard dual-$V_t$ domino logic circuit technique without sleep switches is referred to as a no-sleep dual-$V_t$ domino.

The block diagram of a clock-delayed domino carry lookahead adder with the proposed sleep switch dual-$V_t$ circuit technique is shown in FIG. 4. The circuit 400 of FIG. 4 includes a propagate and generate circuit 402, a look ahead carry generator 404, an invert and delay 406 and a sum generator 408. The clock signal at the clock signal input 110 is fed through delays 410 to the propagate and generate circuit 402, the look ahead carry generator 404 and the sum generator 408. A sleep signal input to the sleep signal input 412 is fed through a-delay 414 to the propagate and generate circuit 402 and the sum generator 408. The inputs to the propagate and generate circuit 402 are shown as 416. Each sum output 418 drives a capacitive load of 10 fF. A 1 GHz clock with a 50% duty cycle is applied to the domino logic circuits through the clock signal input 110. All of the common transistors in the SLS and no control dual-$V_t$ adders are sized the same.

In the SLS adder, all of the propagation (P), generation (G), and sum (S) domino gates have sleep switches. When the domino adder is idle, the P and G domino gates (in the first stage propagate and generate (PG) block) are forced to evaluate via sleep switches. The domino gates within the look ahead carry (C) block do not have sleep switches. Following the evaluation of the P and G gates, the domino gates within the carry block also evaluate in a domino fashion. Some of the signals originating from the PG block are inverted before being fed into the sum block (see FIG. 4). The domino logic circuits within the sum block, therefore, also require sleep switches.

The input vectors applied to an adder are listed in Table 1. The leakage characteristics of the circuits are evaluated for six input vectors, $V_0$ to $V_5$. For the $V_1$ and $V_2$ input vectors, $C_{out}$ and $S_8$, respectively, are evaluated through the critical path of the carry chain within the carry block shown in FIG. 4. The delay and active mode power are calculated for $V_1$ and $V_2$. During evaluation of the noise immunity, the same noise signal is coupled to all of the inputs of a domino logic circuit as this situation represents the worst case noise condition.

TABLE 1

| INPUT VECTORS APPLIED TO AN ADDER | | | | | |
|---|---|---|---|---|---|
| | $V_0$ | $V_1$ | $V_2$ | $V_3$ | $V_4$ | $V_5$ |
| A | 0 | 1 | 1 | 0 | 255 | 255 |
| B | 0 | 255 | 127 | 255 | 0 | 255 |

The low noise margin (NML) is the noise immunity metric used. The NML is defined as $$NML = V_{IL} - V_{OL}, \qquad (1)$$

where $V_{IL}$ is the input low voltage defined as the smaller of the DC input voltages on the voltage transfer characteristic (VTC) at which the rate of change of the dynamic node voltage with respect to the input voltage is equal to one (the unity gain point on the VTC). $V_{OL}$ is the output low voltage.

The proposed sleep switch circuit technique significantly reduces the standby leakage energy as compared to both low-$V_t$ and no-sleep dual-$V_t$ circuits.

The leakage energy consumption (per clock cycle) of the low-$V_t$, no-sleep dual-$V_t$, and SLS adders is shown in FIG. 5. The leakage energy of a no-sleep dual-$V_t$ circuit is reduced by 3.6× to 8.1× as compared to a low-$V_t$ circuit. The standby leakage energy is dependent on the input vector applied to a circuit after the clock signal is gated high. The dynamic nodes of all of the domino logic circuits are precharged when the clock is low. After the clock transitions high, a portion of these domino gates evaluates provided that a necessary input combination to discharge the dynamic node is applied. For the input vector $V_0$, after the clock is gated high, the dynamic nodes of all of the domino logic gates of a no-sleep dual-$V_t$ adder are maintained high. This condition is typically the highest leakage state for a dual-$V_t$ domino logic circuit since all of the high-$V_t$ transistors operate in the strong inversion region. The advantages of dual-$V_t$ for reducing the leakage current are maximized when all of the high-$V_t$ transistors are strongly cutoff during the idle mode. For the input vector $V_0$, the leakage is from the low-$V_t$ transistors rather than the high-$V_t$ transistors. The $V_0$ vector, therefore, represents the worst case leakage input vector for a no-sleep dual-$V_t$ adder. For $V_0$, the leakage reduction of a no-sleep dual-$V_t$ circuit is 3.6× as compared to a low-$V_t$ adder.

As shown in FIG. 5, the proposed sleep switch circuit technique minimizes the leakage energy for all of the input vectors (applied after clock gating) as compared to both the low-$V_t$ and no-sleep dual-$V_t$ circuits. Activating the sleep transistors places all of the domino gates into a low leakage state for any given input vector. The leakage energy reduction offered by the SLS circuit technique varies between 98× and 207× as compared to a low-$V_t$ adder. The proposed circuit technique cuts off all of the high-$V_t$ transistors and thereby exploits the full effectiveness of employing dual-$V_t$ transistors to reduce subthreshold leakage current. The proposed sleep switch circuit technique, therefore, reduces the leakage energy by 12× to 58× as compared to a standard no-sleep dual-$V_t$ adder.

The dependence of the leakage energy of an SLS circuit on the input vectors is due to the variation of the available leakage current conduction paths through the low-$V_t$ transistors in the pulldown network of a domino gate. For example, for $V_5$, all of the pulldown low-$V_t$ transistors of the generate domino gates in the first stage PG block of an adder (see FIG. 4) are fully turned on. The leakage currents from the cutoff high-$V_t$ keeper and pullup transistors passes through the low-$V_t$ pulldown transistors that operate in the strong inversion (or linear) region, thereby increasing the total leakage energy as shown in FIG. 5.

Figure 6:
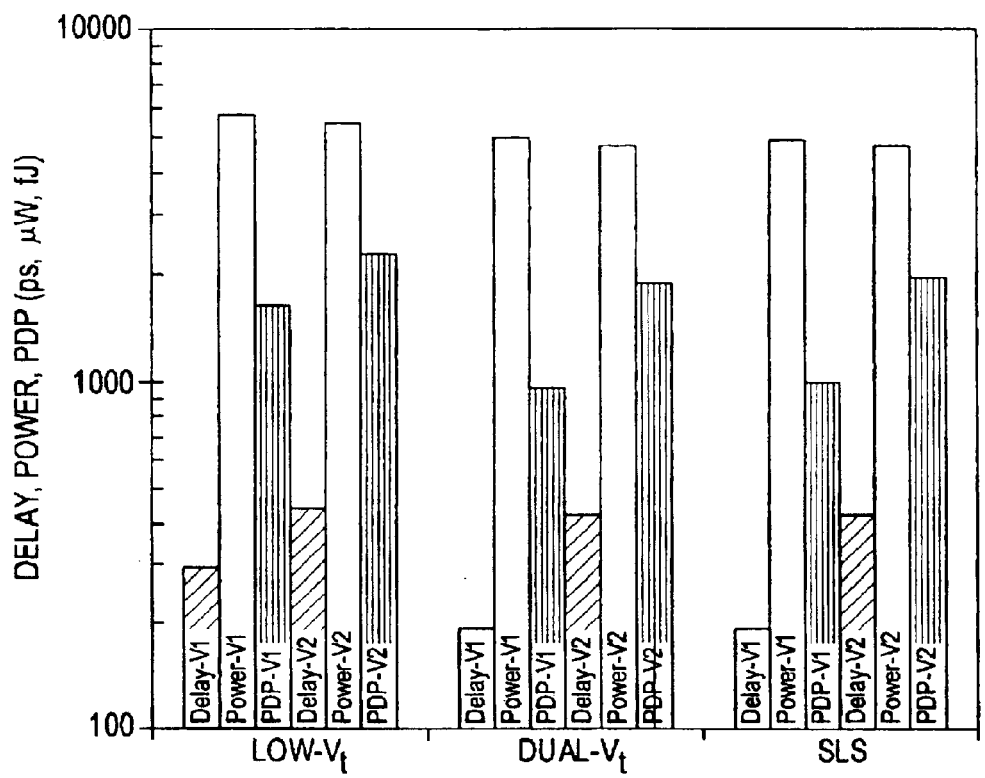
FIG. 6 is a graph showing a comparison of the delay, power, and power delay product (PDP) of the adder circuits with the low-$V_t$, no sleep dual-$V_t$, and SLS circuit techniques for the input vectors $V_1$ and $V_2$.

The active mode delay, power, and power delay product (PDP) of the low-$V_t$, no-sleep dual-$V_t$, and SLS adders are shown in FIG. 6. The delay and power characteristics of a no-sleep dual-$V_t$ adder are similar to SLS. The proposed circuit technique enhances the circuit speed by 32% and 4%, for $V_1$ and $V_2$, respectively, as compared to a low-$V_t$ adder. The enhancement in speed with the proposed circuit technique is primarily due to the reduced contention current of a high-$V_t$ keeper.

The proposed sleep switch dual-$V_t$ circuit technique also significantly reduces the active mode power consumption as compared to a low-$V_t$ circuit. The power dissipation is reduced by 14% and 13% for the input vectors $V_1$ and $V_2$, respectively, as compared to a low-$V_t$ adder. A portion of the active mode power savings is due to the reduced contention current of the high-$V_t$ keeper transistor in a dual-$V_t$ circuit (see FIGS. 2B, 3A and 3B). Another important factor that reduces the power consumption of a dual-$V_t$ circuit is the lower power consumed in the delay elements. As shown in FIG. 4, several delay elements (the inverters) are inserted along specific signal paths to delay the transfer of the clock, propagate, and carry signals among the circuit blocks. The delay elements in a dual-$V_t$ domino adder (see FIG. 4) are implemented with high-$V_t$ transistors, increasing the delay of a single inverter. The number of inverters required in a signal path to satisfy the delay requirements, therefore, decreases, thereby reducing the active power dissipated by the signal delay paths.

In a standard domino logic gate, a feedback keeper is employed to maintain the state of the dynamic node against coupling noise, charge sharing, and subthreshold leakage current. In a dual-$V_t$ domino logic circuit, the keeper transistor has a high-$V_t$ (see FIGS. 2B, 3A and 3B). The current supplied by a high-$V_t$ keeper to preserve the state of a dynamic node is reduced, thereby degrading the noise immunity as compared to a low-$V_t$ circuit. The degradation of NML varies for different blocks within an adder. The average degradation in NML for the propagation (P), generation (G), carry (C), and sum (S) domino logic gates are listed in Table 2. The degradation in NML of SLS domino logic gates varies between 15.5% and 28.6% as compared to the low-$V_t$ circuits.

TABLE 2

DEGRADATION IN NOISE MARGIN LOW (NML) OF SLS AS COMPARED TO LOW-$V_t$

|  | P | G | C | S |
|---|---|---|---|---|
| Average NML Reduction | 15.5% | 28.6% | 18.7% | 15.6% |

When a domino logic circuit is idle, the clock is gated high and the sleep switches are activated to force all of the domino gates to evaluate. After the node voltages settle, all of the high-$V_t$ transistors are strongly cut off, thereby minimizing the subthreshold leakage currents with the proposed SLS circuit technique. Depending upon the input vector, from 493 ps to 586 ps is required (after the clock is gated) for the adder circuit to be placed in a low leakage state. The clock is reactivated and all of the dynamic nodes are recharged to activate a sleeping domino circuit. The duration of reactivation is equal to the precharge time of a domino circuit. An adder circuit, therefore, is able to enter and leave the standby mode within a single clock cycle with the proposed circuit technique.

The energy overhead for entering and leaving the sleep mode with the proposed technique is also evaluated. Activating the sleep switches to place a dual-$V_t$ domino logic circuit into standby mode requires a specific amount of energy. Additional energy is dissipated at the end of an idle period while precharging the dynamic nodes in order to reactivate a domino logic circuit. All of the dynamic nodes in a domino circuit are discharged during the sleep mode with the proposed circuit technique. The activation energy required by the proposed circuit technique is, therefore, typically higher than the low-$V_t$ and no-sleep dual-$V_t$ circuit techniques. In order to justify the proposed sleep switch circuit technique to force a dual-$V_t$ circuit into a low leakage state, the total energy consumed for entering and leaving the sleep mode must be less than the total savings in standby leakage energy.

Figure 7:
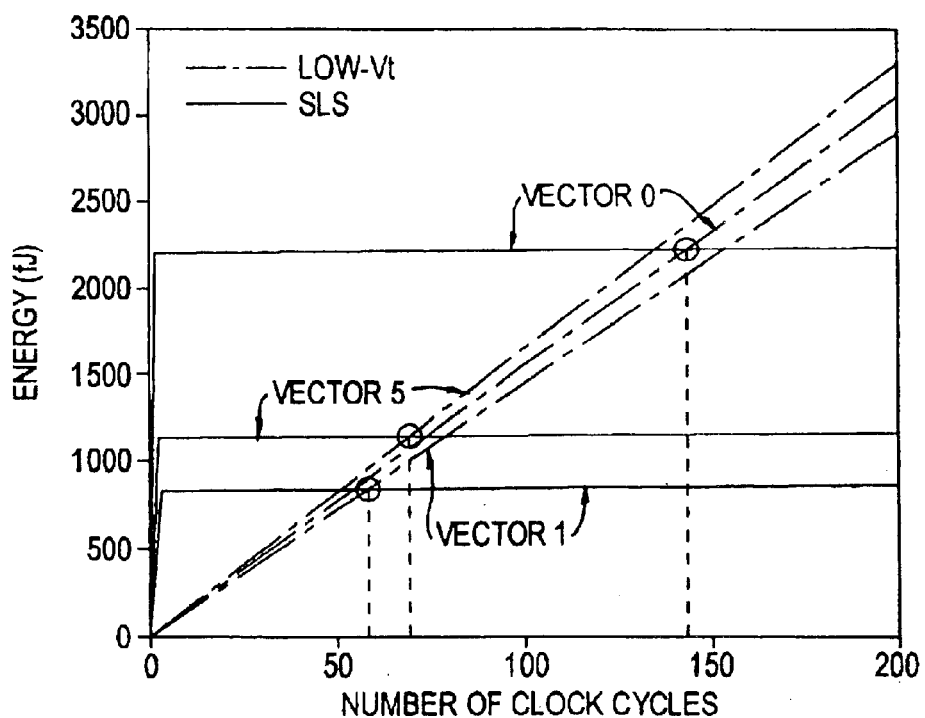
FIG. 7 is a graph showing cumulative standby energy dissipation of the low-$V_t$ and SLS adders for three different input vectors.

The cumulative energy dissipated in the standby mode by the low-$V_t$ and SLS adders is shown in FIG. 7. It is assumed that the junction temperature does not significantly change for the duration of the standby mode. The leakage energy per cycle is assumed to be constant. The energy of a low-$V_t$ domino circuit is only affected by the cumulative leakage current during the standby mode. Alternatively, both the cumulative leakage energy and the energy overhead of entering and leaving the sleep mode are included in the energy characteristics of SLS. The total energy overhead of the proposed sleep switch circuit technique is independent of the duration of the idle mode. The total energy overhead for employing the proposed circuit technique is dissipated even if a domino circuit stays in the standby mode for only a single clock cycle. The total energy overhead of the proposed technique (composed of the energy dissipated in order to activate the sleep transistors and reactivate of the domino gates after the standby mode is over) is included as an energy step in the first cycle of the standby mode (see FIGS. 7 and 8). Similar to the low-$V_t$ and no-sleep dual-$V_t$ energy characteristics, after the first clock cycle, the SLS energy is also only due to the subthreshold leakage current. Since the standby leakage energy of the proposed SLS circuit is significantly lower (up to 207×) than a low-$V_t$ circuit, the SLS energy characteristics are relatively flat as compared to the energy characteristics of the low-$V_t$ adder (see FIG. 7). A specific amount of time in the idle mode, also dependent upon the input vectors, is necessary for the cumulative leakage energy of a low-$V_t$ circuit to exceed the cumulative energy of an SLS circuit.

The intersection of the SLS and low-$V_t$ cumulative energy characteristics can be used to determine the necessary minimum duration of the sleep mode of operation such that the SLS circuit technique offers a net savings in energy as compared to a low-$V_t$ circuit. As shown in FIG. 7, the cumulative subthreshold leakage of the low-$V_t$ and SLS circuits exhibit different behavior depending upon the input vectors. The leakage of a low-$V_t$ adder is smallest for $V_2$ and highest for $V_5$. Alternatively, the leakage energy of an SLS adder is lowest for $V_0$ and largest for $V_5$. For $V_0$, all the dynamic nodes within a no-sleep dual-$V_t$ circuit remain high after the clock is gated high. $V_0$ is, therefore, the input vector at which the leakage energy of a no-sleep dual-$V_t$ circuit is highest. Depending upon the input vectors, the energy overhead of the proposed SLS scheme also changes. For $V_0$, none of the dynamic nodes of the low-$V_t$ and no-sleep dual-$V_t$ circuits are discharged during the standby mode. Alternatively, all of the dynamic nodes are discharged in an SLS circuit. The energy overhead of the SLS circuit technique required to recharge the dynamic nodes to reactivate the circuit (after the standby mode) is, therefore, highest for $V_0$. As shown in FIG. 7, a minimum of 59 clock cycles is required for the proposed SLS circuit technique to provide a net savings in energy as compared to a low-$V_t$ circuit during the standby mode.

As discussed previously, a no-sleep dual-$V_t$ circuit offers 3.6× to 8.1× leakage savings as compared to a low-$V_t$ circuit. The energy savings of a no-sleep dual-$V_t$ domino circuit originates from the selective replacement of a group of high leakage low-$V_t$ transistors with a group of low leakage high-$V_t$ transistors. Unlike the proposed SLS circuit technique, a standard no-sleep dual-$V_t$ circuit does not introduce any energy overhead in order to reduce the standby leakage current. Although the leakage energy of an SLS circuit is shown to be significantly reduced as compared to a no-sleep dual-$V_t$ circuit, the non-negligible energy overhead of the proposed circuit technique must also be assessed to accurately compare the energy characteristics of the two circuit techniques. The cumulative energy dissipated during standby mode by the SLS and no-sleep dual-$V_t$ adders is shown in FIG. 8.

The energy step of the SLS characteristics during the first cycle represents the energy overhead for activating the sleep switches (to enter the sleep mode) and for recharging the domino gates (to exit the sleep mode). Since the proposed SLS circuit technique reduces the standby leakage energy by 12× to 58× as compared to a no-sleep dual-$V_t$ circuit, the SLS characteristics are relatively flat, after the first cycle, as compared to the energy characteristics of a no-sleep dual-$V_t$ adder. As discussed previously, $V_0$ produces the highest leakage state in a no-sleep dual-$V_t$ circuit. The lowest savings in leakage energy by a dual-$V_t$ circuit is, therefore, observed at $V_0$. Alternatively, the leakage energy of a no-sleep dual-$V_t$ adder is lowest for $V_1$. No input combination exists that can place a no-sleep dual-$V_t$ adder into a lower leakage state as compared to an SLS adder. The technique proposed by Kao is, therefore, ineffective for minimizing the leakage of a domino logic circuit such as the domino adder discussed.

Figure 8:
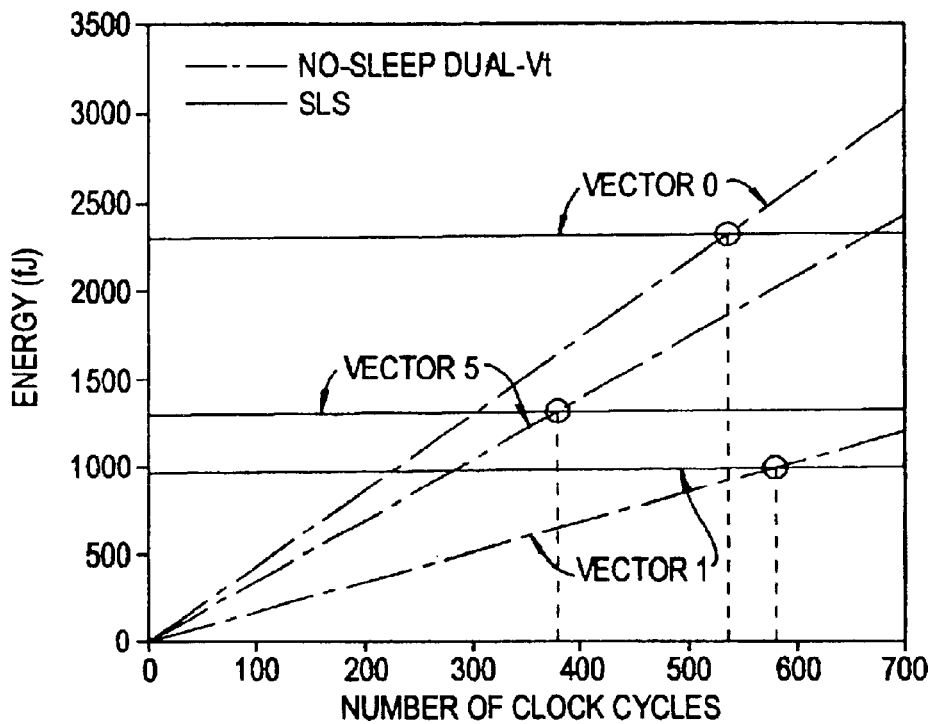
FIG. 8 is a graph showing cumulative standby energy dissipation of the SLS and no-sleep dual-$V_t$ adders for three different input vectors.

As shown in FIG. 8, a minimum of 381 clock cycles is required for the proposed SLS circuit technique to provide a net savings in energy as compared to a no-sleep dual-$V_t$ circuit during the standby mode. Although the leakage energy of a no-sleep dual-$V_t$ domino circuit is 12× to 58× higher as compared to SLS, a no-sleep dual-$V_t$ circuit technique is preferable in those applications with short idle periods (less than 381 clock cycles).

The relative energy overhead of the proposed sleep switch circuit technique will be reduced since the subthreshold leakage is expected to increase with technology scaling. Significant savings in energy will be possible for even shorter idle periods with the proposed sleep switch dual-$V_t$ circuit technique. Time-wise finer grain leakage reduction will, therefore, be feasible, permitting the utilization of the proposed scheme to implement a system level aggressive leakage reduction policy in the future.

A second preferred embodiment of the present invention will now be presented. The low swing circuit technique has become an attractive method to reduce power in high performance integrated circuits. This technique has primarily been applied to I/O drivers and long interconnects. Static CMOS circuits driven by low swing input signals dissipate excessive static power while displaying poor delay characteristics. Specialized voltage interface circuits are therefore required to transfer signals between static CMOS circuits operating at different voltage levels. The circuit delay and complexity of low swing static CMOS circuits increase while the power reduction attained by lowering the node voltages diminish due to these additional voltage interface circuits. Therefore, low swing circuit techniques have not been applied to modify the voltage swing of signals driving CMOS static gates. Low swing circuit techniques, as proposed in this patent, can be effective in domino logic circuits. In a domino gate, the input signals are applied only to the NMOS transistors in the pull-down path, while a single pull-up PMOS transistor is driven by a separate clock signal. Therefore, a low swing signal that transitions between ground and a second sufficiently high voltage level to effectively turn on an NMOS transistor does not impose any functional or static power consumption problems in domino logic circuits.

Low swing circuit techniques are applied to domino logic circuits in order to reduce the dynamic power. The voltage swings at the internal nodes of domino logic circuits are modified. Two low swing domino logic circuit techniques are proposed as part of the second preferred embodiment. The first proposed low swing domino circuit uses a fully driven keeper. A second proposed domino circuit reduces both the voltage swing at the output node and at the gate of the keeper with a weak keeper.

Figure 9:
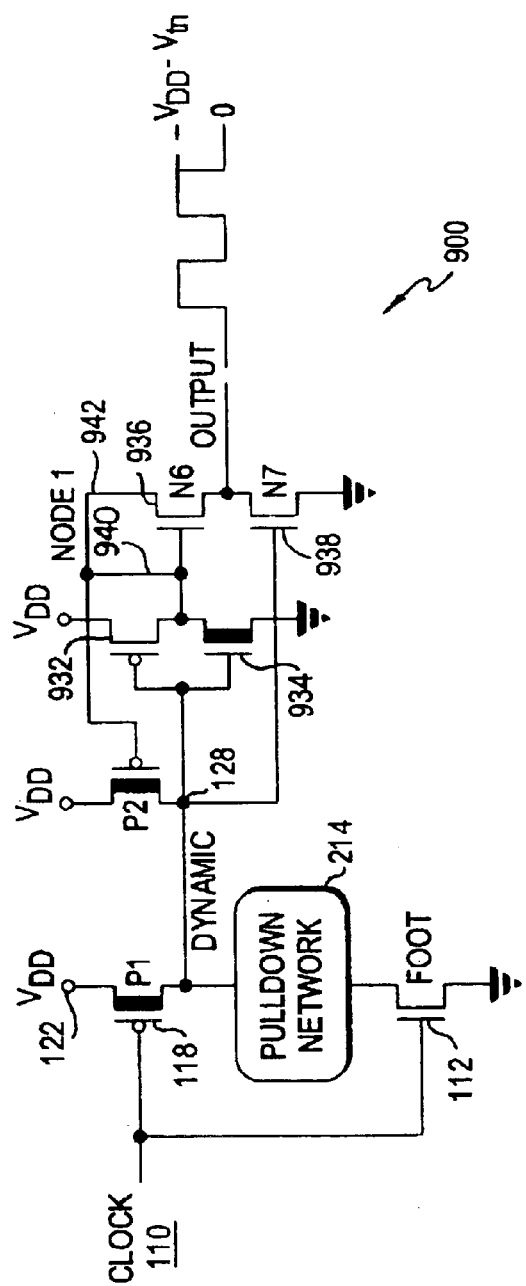
FIG. 9 shows a circuit diagram of a low swing domino logic circuit technique with fully driven keeper (LSDFDK) according to a second preferred embodiment of the present invention.

A low swing domino logic with a fully driven keeper (LSDFDK) is proposed in this patent. A generic domino logic gate based on the proposed LSDFDK circuit technique is shown in FIG. 9. In the logic gate 900, an output circuit 930 includes two transistors 932, 934 in parallel and also includes a feedback to the keeper P2 124 through an NMOS transistor N6 936 and a direct path 940. Also, the output is selectively grounded through a switch N7 938 receiving a control signal from the dynamic node 128.

Figure 11:
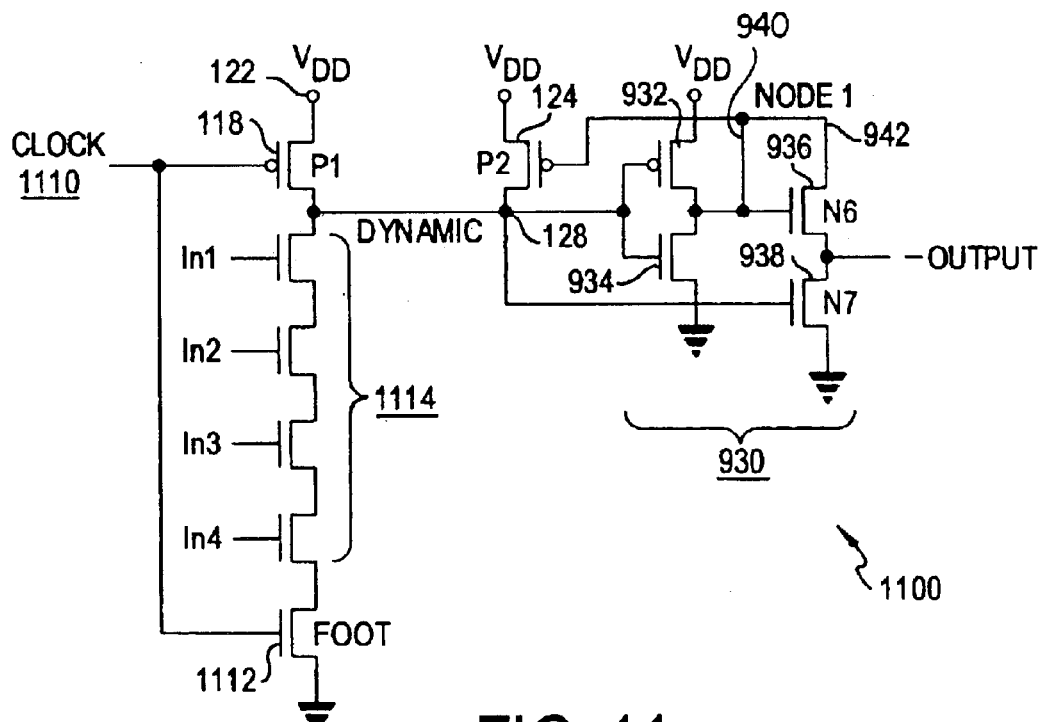
FIG. 11 shows a circuit diagram of a four-input AND gate based on the circuit of FIG. 9.
Figure 10:
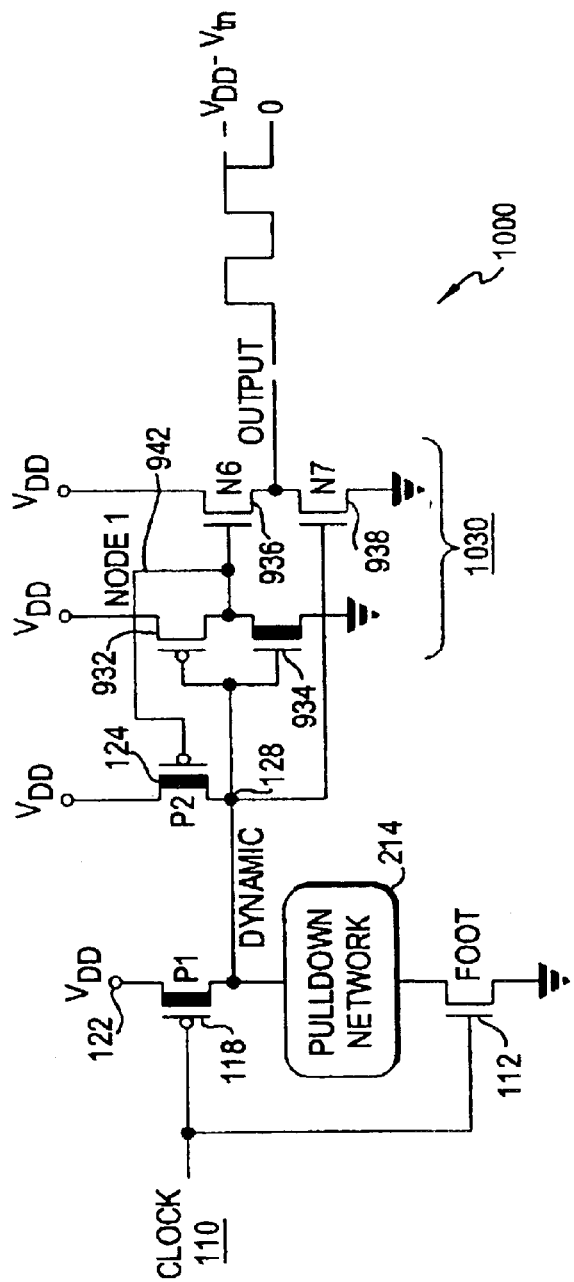
FIG. 10 shows a circuit diagram of a modification of the circuit of FIG. 9.

The proposed circuit technique reduces the voltage swing at the output node using the NMOS transistor (N6 936) as a pull-up. The output voltage swings between ground and $V_{DD}$-$V_{tn}$. The voltage swing at the output node is reduced, thereby reducing the dynamic switching power consumed to drive the parasitic impedances of the transistors and the interconnect connected to the output node. The keeper (P2 124) is driven with a full swing signal for improved noise immunity. In FIG. 9, the source of the transistor N6 936 is connected to node 1 942. Alternatively, the source of N6 can be connected to $V_{DD}$ as shown in FIG. 10 in the output circuit 1030 of the circuit 1000. This configuration improves the delay since the capacitive load at node 1 is reduced. A four input AND gate implemented using the proposed low swing domino logic circuit technique, LSDFDK, is shown in FIG. 11 as 1100, using four-bit pulldown (AND) logic 1114.

In a modification of the second preferred embodiment, a reduced keeper gate drive technique is proposed to improve the delay and power characteristics of domino circuits while maintaining robustness against noise. This technique reduces the contention current by lowering the gate voltage swing of a keeper transistor.

Figure 12:
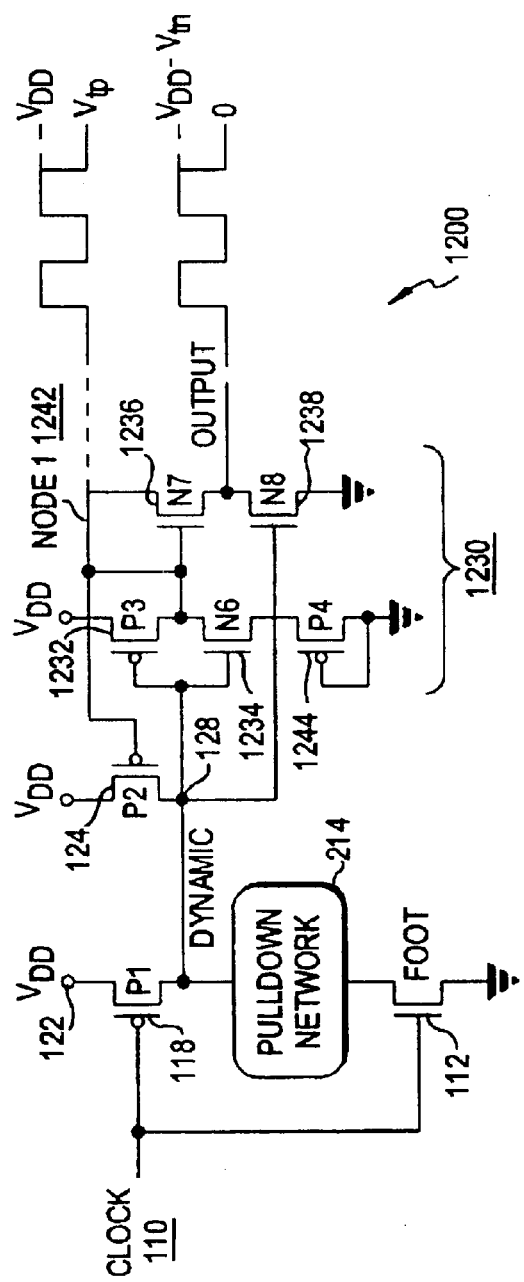
FIG. 12 shows a circuit diagram of a low swing domino logic circuit technique with weakly driven keeper (LSDWDK) according to a variation of the second preferred embodiment of the present invention.

A generic domino logic gate based on the proposed low swing domino logic with a weakly driven keeper circuit technique (LSDWDK) is shown in FIG. 12 as 1200. The output circuit 1230 includes transistors P3 1232 and N6 1234 in parallel. The keeper P2 124 is driven by both a transistor N7 1236 and a direct connection 1240 through node 1 1242. The output is also selectively grounded through a transistor N8 1238, which receives a control signal from the dynamic node 128. The transistor N6 1234 is selectively grounded through a transistor P4 1244.

Figure 13:
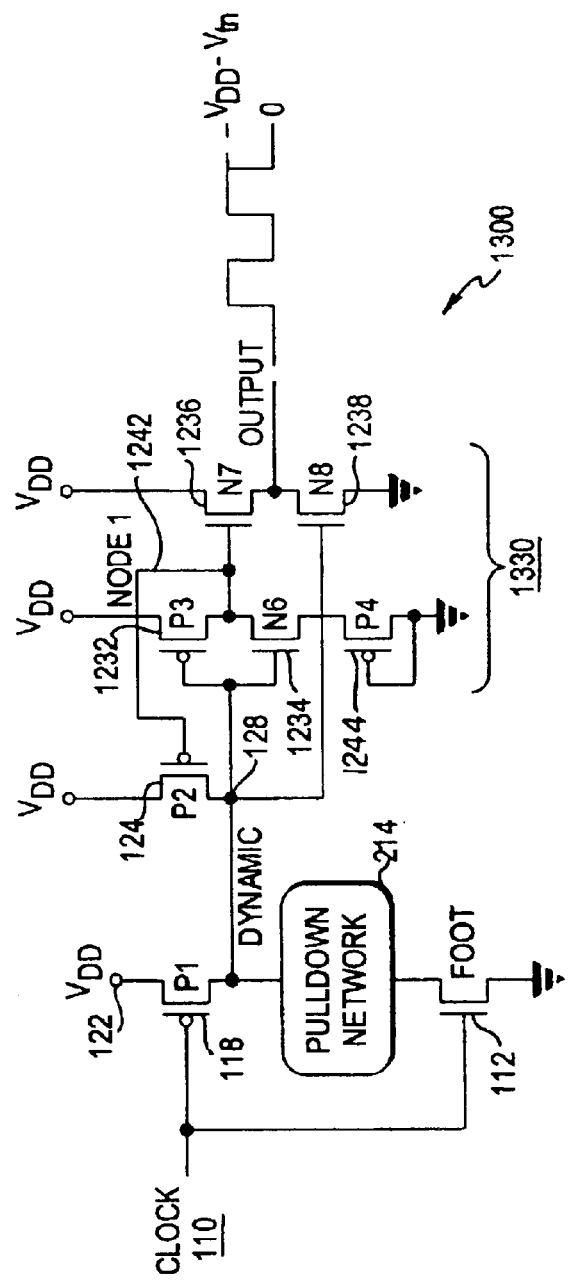
FIG. 13 shows a circuit diagram of a modification of the circuit of FIG. 12.

The weak keeper is critical in low swing circuits since the effects of the contention current on the evaluation delay is worse due to the reduced gate drive of the pull-down network transistors. LSDWDK produces two different voltage swings. The output voltage swing is between ground and $V_{DD}-V_{tn}$. The gate voltage swing of the keeper (P2 128) is also modified using the PMOS transistor, P4. The gate voltage of the keeper P2 128 swings between $|V_{tp}|$ and $V_{DD}$ (assuming $|V_{tp}| \leq V_{tn}$). This voltage swing reduces the contention current as compared to LSDFDK, thereby, lowering the evaluation delay and the dynamic power. The tradeoff is a reduced noise margin due to the weaker keeper transistor. In FIG. 12, the source of the transistor N7 1236 is connected to node 1 1242. Alternatively, the source of N7 can be connected to $V_{DD}$ as shown in the output circuit 1330 of the circuit 1300 of FIG. 13. This configuration improves the delay since the capacitive load at node 1 is reduced. A four input domino AND gate based on the proposed low swing domino logic circuit technique, LSDWDK, is shown in FIG. 14 as 1400.

The standard domino (SDK), LSDFDK, and LSDWDK circuit techniques are evaluated for a three stage pipeline 1500 (see FIG. 15) having a pipeline input 1502 and a pipeline output 1504. Each of the three stages 1506, 1508, 1510 includes a four input AND gate assuming a 0.18 μm CMOS technology. $V_{tn}$ and $|V_{tp}|$ are assumed to be 200 mV. Each AND gate drives the four inputs of the following stage AND gate (the inputs of each AND gate are tied together and driven by the same signal). The third stage 1510 of the LSDFDK and LSDWDK pipelines is assumed to be a four input SDK AND gate to recover the full swing signal at the output of the pipeline. A 1 GHz clock signal with a 50% duty cycle is applied to each pipeline.

Figure 16A:
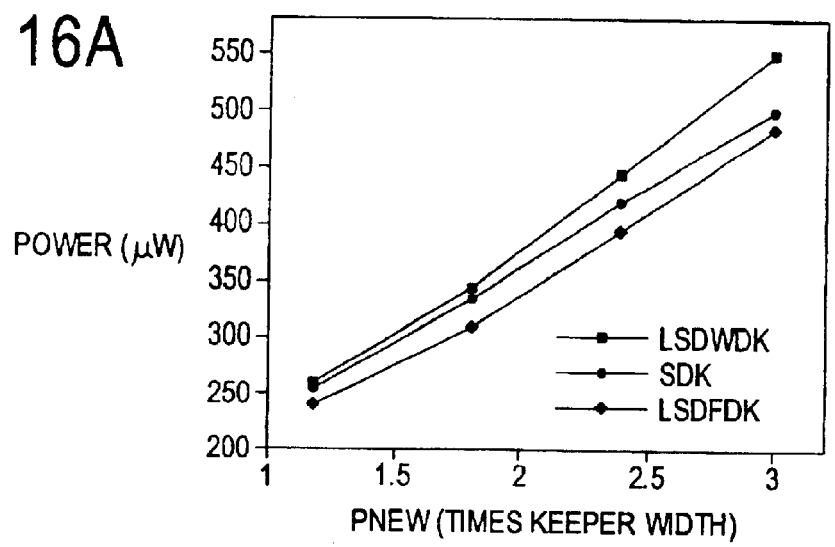
FIGS. 16A–16C are graphs showing simulation results derived from the three-stage pipeline of FIG. 15.
Figure 16B:
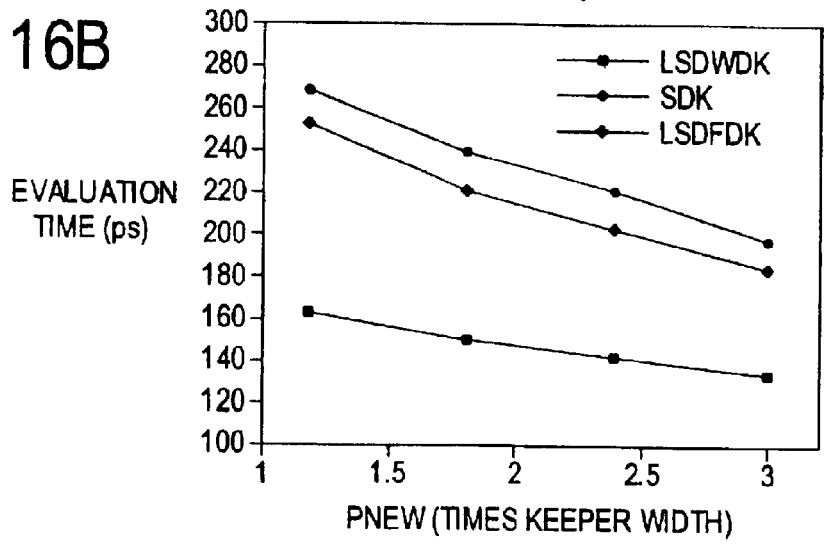
Figure 16C:
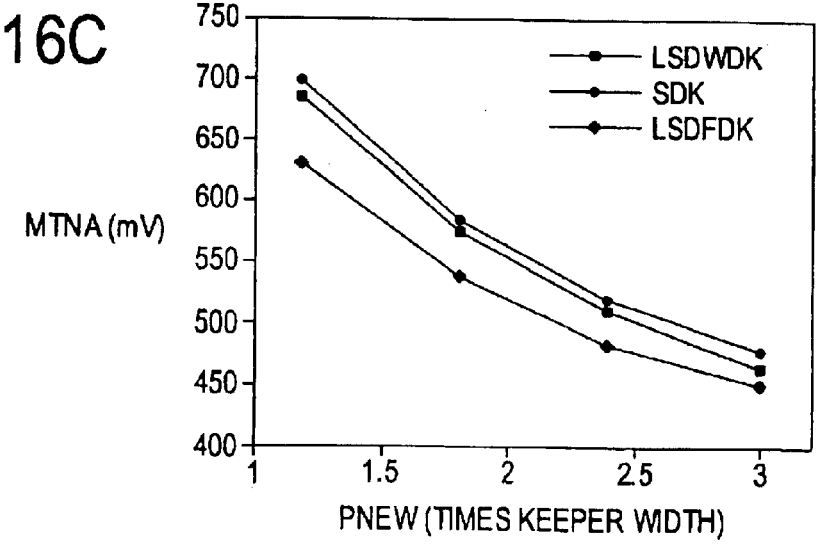

The size of the transistors in the pull-down network is critical for improving the evaluation delay of the domino logic circuits. The width of the keeper is minimum ($W_{min}$) for each circuit. The equivalent width of the pull-down network (PNEW) is a multiple of the keeper width and is varied to evaluate the delay, power, and noise immunity tradeoffs. The evaluation delay is calculated from 50% of the signal swing applied at the input of the first stage AND gate to 50% of the signal swing observed at the output of the third stage AND gate within each pipeline. To evaluate the noise immunity, the noise signal is assumed to be a square wave with a 450 ps duration. The maximum tolerable noise amplitude (MTNA) is defined as the signal amplitude at the input of the first stage AND gate that induces a 10% drop in the voltage at the dynamic node of the second stage AND gate. The pull-down and the foot transistors are the same size. The active power, evaluation delay, and MTNA for each of these three domino circuits are shown in FIGS. 16A–16C. Normalized results (for PNEW=3) are listed in Table 3.

TABLE 3

NORMALIZED DYNAMIC POWER, EVALUATION DELAY, AND MTNA (PNEW = 3)

|  | Power | Delay | MTNA |
|---|---|---|---|
| SDK | 1.00 | 1.00 | 1.00 |
| LSDFDK | 0.91 | 1.46 | 1.03 |
| LSDWDK | 0.88 | 1.38 | 0.98 |

Simulation results for different pull-down network transistor sizes for a constant keeper size ($W_{keeper}=W_{min}$) are shown in FIGS. 16A–16C. FIG. 16A shows power versus pull-down network equivalent width (PNEW). FIG. 16B shows evaluation time versus PNEW. FIG. 16C shows maximum tolerable noise amplitude (MTNA) versus PNEW.

The simulation results show that the proposed low swing circuit technique is effective for lowering the active mode power consumption of domino logic circuits. As shown in FIG. 16A, LSDFDK reduces the power consumption by up to 9.4% as compared to SDK with increasing PNEW. LSDWDK offers an additional power savings since the contention current is decreased by weakening the keeper (reduced current drive for the same size keeper as compared to both LSDFDK and SDK). LSDWDK reduces the power consumption by up to 12.4% as compared to SDK. The power savings of both LSDWDK and LSDFDK increase as compared to SDK with increasing PNEW. For all three circuits, the active power consumption increases as the size of the pull-down network increases.

Increased PNEW reduces the evaluation delay due to the increased current drive of the pull-down network. However, as shown in FIG. 16B, both LSDWDK and LSDFDK sacrifice some speed for reduced power. As listed in Table 3, the evaluation delay is 46% higher for LSDFDK and 38% higher for LSDWDK as compared to SDK (for PNEW=3). LSDWDK offers enhanced delay characteristics as compared to LSDFDK due to the reduced contention current. As shown in FIG. 16B, the LSDWDK evaluation delay is up to 8.6% lower than the LSDFDK evaluation delay.

Another tradeoff for increased performance of each circuit with increasing PNEW is reduced noise immunity. As shown in FIG. 16C, the maximum tolerable noise amplitude decreases with increasing PNEW. LSDFDK not only lowers the power consumption but also displays higher noise immunity characteristics as compared to SDK. This behavior is due to the noise suppressing effect of the NMOS transistor providing the pull-up at the output (N6 in FIGS. 9 to 11) as the noise signal is transferred to the following gates. The MTNA of LSDFDK is up to 2.6% higher than the MTNA of SDK, and up to 10.9% higher than the MTNA of LSDWDK. Since the keeper of LSDWDK is weak, the MTNA of LSDWDK is 8.7% less than the MTNA of SDK for PNEW= 1.2. With increasing PNEW, the relative effect of the keeper on the noise immunity of the domino circuits is reduced. The difference between the MTNA of LSDWDK and SDK therefore is reduced to 2.1% from 8.7% as the PNEW increases from 1.2 to 3. Similarly, the MTNA advantages of LSDFDK as compared to SDK increases from 1.3% to 2.6% as the PNEW increases from 1.2 to 3. As shown in FIGS. 16A–16C, with increasing PNEW, the power advantages of both LSDWDK and LSDFDK increase as compared to SDK while the evaluation times of all three circuits become more similar. Therefore, low swing domino logic circuits are expected to become more attractive as the pull-down network is scaled for higher performance.

A third preferred embodiment of the present invention will now be presented. The third preferred embodiment combines concepts from the first and second preferred embodiments.

The proposed low swing domino circuits are effective in reducing the power consumed during the active mode of operation. The standby mode power characteristics of the proposed circuits, however, are comparable to standard domino (SDK). In the third preferred embodiment, the proposed sleep switch dual-$V_t$ circuit technique is applied to the proposed low swing domino logic circuits.

Figure 17:
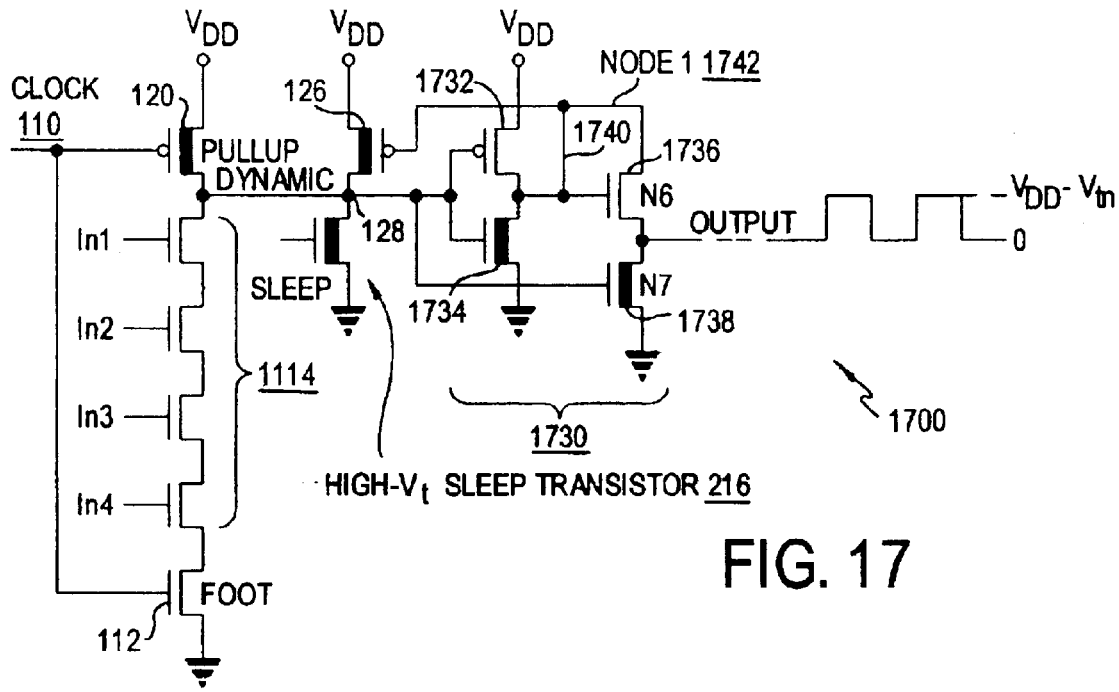
FIG. 17 shows a circuit diagram of a four input domino AND gate based on the proposed low swing domino and sleep switch dual threshold voltage domino logic circuit techniques according to the third preferred embodiment of the present invention.

A four input domino AND gate based on the proposed low swing domino logic with fully driven keeper and sleep switch dual-$V_t$ circuit techniques is shown in FIG. 17 as 1700. A high-$V_t$ sleep transistor 216 is connected at the dynamic node 128. The output circuit 1730 includes a low-$V_t$ transistor 1732 and a high-$V_t$ transistor 1734 in parallel. In addition, the output is fed back to the keeper 126 through node 1 1742 by both a transistor N6 1736 and a direct connection 1740. The output is also selectively grounded through a high-$V_t$ transistor 1738.

Figure 18:
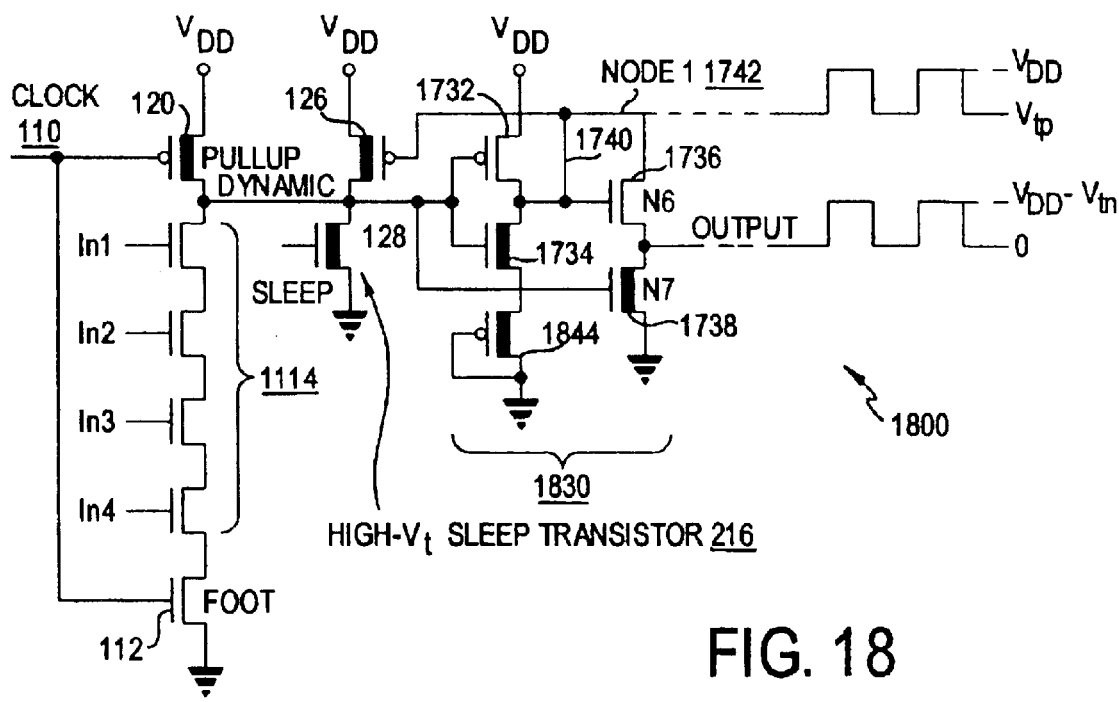
FIG. 18 shows a circuit diagram of a four input domino AND gate based on the proposed low swing domino and sleep switch dual threshold voltage domino logic circuit techniques according to the third preferred embodiment of the present invention.

A four input domino AND gate based on the proposed low swing domino logic with weakly driven keeper and sleep switch dual-$V_t$ circuit techniques is shown in FIG. 18 as 1800. The output circuit 1830 of FIG. 18 differs from the output circuit 1730 of FIG. 17 in that the transistor 1734 is selectively grounded through a high-$V_t$ transistor 1844.

The circuits shown in FIGS. 17 and 18 are evaluated for both active and standby modes of operation. The effects of modifying the threshold voltage distribution of the transistors on the power and performance characteristics of the circuits are examined. LSDFDK and LSDWDK are evaluated for high threshold voltages only, low threshold voltages only, and dual threshold voltages. Same size transistors and circuit configurations are used for all three threshold voltage distributions. The low-$V_t$ is assumed to be 200 mV and the high-$V_t$ is assumed to be 400 mV. The PNEW is 2.4. The standby mode leakage power, the active mode total power, and the evaluation delay of the proposed low swing circuits are listed in Table 4.

These results demonstrate that the proposed sleep switch dual threshold voltage domino logic circuit technique is a powerful method to simultaneously reduce the standby power, active mode total power, and the evaluation delay of the proposed low swing domino logic circuits as compared to standard low-$V_t$ circuits. As listed in Table 4, the standby power of the SLS LSDWDK is 237 times smaller than in low-$V_t$ LSDWDK. Similarly, SLS LSDFDK consumes 235 times less leakage power as compared to low-$V_t$ LSDFDK operating in the standby mode. Another advantage of the proposed low swing SLS domino logic circuits is the reduced active mode total power. This behavior is primarily caused by the weaker high-$V_t$ pull-up transistors, P1 and P2 (reduced contention current). As listed in Table 4, low-$V_t$ LSDWDK consumes 1.7% more active power than SLS LSDWDK. Similarly, the active power consumption of the low-$V_t$ LSDFDK is 2.1% higher than the power consumption of the SLS LSDFDK.

Another advantage of the dual-$V_t$ implementation is reduced evaluation delay. The SLS technique improves slightly the evaluation time of both LSDWDK and LSDFDK as compared to the low-$V_t$ circuits. This behavior is again due to the reduced contention current due to the weaker high-$V_t$ pull-up transistors.

The primary drawback of the SLS circuits as compared to the low-$V_t$ circuits is reduced noise immunity. As listed in Table 4, MTNA is reduced by 4.3% (2.3%) for SLS LSDWDK (SLS LSDFDK) as compared to low-$V_t$ LSDWDK (low-$V_t$ LSDFDK). This behavior is primarily caused by the reduced current drive of the high-$V_t$ keeper.

While preferred embodiments and variations thereon have been set forth above in detail, those skilled in the art who have reviewed the present disclosure will readily appreciate that other embodiments can be realized within the scope of the invention. For example, numerical values are illustrative rather than limiting, as are recitations of particular transistor technology. Also, while specific logic circuits such as AND gates have been disclosed, other circuits can be realized. Therefore, the present invention should be construed as limited only by the appended claims.

We claim:

1. A domino logic circuit comprising:
   a domino logic processing section;
   an output in communication with the domino logic processing section at a dynamic node;
   a pull-up switch, in communication with the domino logic processing section at the dynamic node, for selectively connecting the domino logic processing section to a voltage source in accordance with a clock signal;
   a keeper, in communication with the domino logic processing section at the dynamic node, for selectively connecting the domino logic processing section to the voltage source in accordance with a feedback signal fed back from the output;

TABLE 4

STANDBY MODE LEAKAGE POWER, ACTIVE MODE TOTAL POWER, EVALUATION DELAY, AND MTNA FOR DIFFERENT THRESHOLD VOLTAGE DISTRIBUTIONS.

| $V_t$ Distribution | Leakage Power (nW) | | Active Power ($\mu$W) | | Evaluation Delay (ps) | | MTNA (mV) | |
|---|---|---|---|---|---|---|---|---|
| | LSDWDK | LSDFDK | LSDWDK | LSDFDK | LSDWDK | LSDFDK | LSDWDK | LSDFDK |
| Low-$V_t$ | 180.80 | 264.70 | 402.3 | 413.0 | 216 | 231 | 488 | 520 |
| SLS Dual-$V_t$ | 0.76 | 1.12 | 395.7 | 404.4 | 212 | 229 | 467 | 513 |
| High-$V_t$ | 0.73 | 1.10 | 341.3 | 348.4 | 355 | 400 | 685 | 732 | a feedback loop for supplying the feedback signal from the output to the keeper; and a sleep switch, in communication with the dynamic node, for grounding the dynamic node in accordance with a sleep signal;

wherein the output comprises an inverter which comprises a dual-$V_t$ circuit;

wherein the dual-$V_t$ circuit comprises:

a first transistor having a first $V_t$; and a second transistor having a second $V_t$ which is higher than the first $V_t$; and wherein the sleep switch comprises a transistor having the second $V_t$.

2. The domino logic circuit of claim 1, wherein each of the pull-up switch and the keeper comprises a transistor having the second $V_t$.

3. A domino logic circuit comprising:

a domino logic processing section;

an output in communication with the domino logic processing section at a dynamic node;

a pull-up switch, in communication with the domino logic processing section at the dynamic node, for selectively connecting the domino logic processing section to a voltage source in accordance with a clock signal;

a keeper, in communication with the domino logic processing section at the dynamic node, for selectively connecting the domino logic processing section to the voltage source in accordance with a feedback signal fed back from the output;

a feedback loop for supplying the feedback signal from the output to the keeper; and a sleep switch, in communication with the dynamic node, for grounding the dynamic node in accordance with a sleep signal;

wherein the output comprises an inverter and a low-swing circuit for reducing a voltage swing at the output to less than a magnitude of a voltage VDD from the voltage source.

4. The domino logic circuit of claim 3, wherein the feedback signal is in a range equal to the full voltage swing between the ground and VDD.

5. The domino logic circuit of claim 3, wherein the feedback signal is in a range less than the full voltage swing between the ground and VDD.

6. A domino logic circuit comprising:

a domino logic processing section;

an output in communication with the domino logic processing section at a dynamic node;

a pull-up switch, in communication with the domino logic processing section at the dynamic node, for selectively connecting the domino logic processing section to a voltage source in accordance with a clock signal;

a keeper, in communication with the domino logic processing section at the dynamic node, for selectively connecting the domino logic processing section to the voltage source in accordance with a feedback signal fed back from the output; and a feedback loop for supplying the feedback signal from the output to the keeper;

wherein the output comprises:

an inverter; and a low-swing circuit for reducing a voltage swing at the output to less than a magnitude of a voltage VDD from the voltage source.

7. The domino logic circuit of claim 6, wherein the feedback signal is in a range equal to the full voltage swing between the ground and VDD (power supply).

8. The domino logic circuit of claim 6, wherein the feedback signal is in a range less than the full voltage signal between the ground and VDD.

9. A method for reducing power consumption in a domino logic circuit during sleep mode, the method comprising:

(a) providing the domino logic circuit comprising:

a domino logic processing section;

an output in communication with the domino logic processing section at a dynamic node, wherein the output comprises an inverter which comprises a dual-$V_t$ circuit, wherein the dual-$V_t$ circuit comprises a first transistor having a first $V_t$ and a second transistor having a second $V_t$ which is higher than the first $V_t$;

a pull-up switch, in communication with the domino logic processing section at the dynamic node, for selectively connecting the domino logic processing section to a voltage source in accordance with a clock signal;

a keeper, in communication with the domino logic processing section at the dynamic node, for selectively connecting the domino logic processing section to the voltage source in accordance with a feedback signal fed back from the output;

a feedback loop for supplying the feedback signal from the output to the keeper; and a sleep switch, in communication with the dynamic node, for grounding the dynamic node in accordance with a sleep signal, the sleep switch comprising a transistor having the second $V_t$;

(b) during the sleep mode, supplying the sleep signal to the sleep switch; and (c) to restore the domino logic circuit from the sleep mode to an active mode, removing the sleep signal from the sleep switch.

10. A domino logic circuit comprising:

a domino logic processing section;

an output in communication with the domino logic processing section at a dynamic node;

a pull-up switch, in communication with the domino logic processing section at the dynamic node, for selectively connecting the domino logic processing section to a voltage source in accordance with a clock signal;

a sleep switch, in communication with the dynamic node, for grounding the dynamic node in accordance with a sleep signal;

wherein the output comprises a first transistor and a second transistor, the first transistor having a first $V_t$ and the second transistor having a second $V_t$ which is higher than the first $V_t$, and wherein the sleep switch comprises a transistor having the second $V_t$.

11. The domino logic circuit of claim 10, wherein the domino logic processing section is selectively grounded through a foot transistor.

12. The domino logic circuit of claim 11, further comprising:

a keeper, connected between the dynamic node and the voltage source, for selectively connecting the voltage source to the dynamic node in accordance with a feedback signal; and a feedback loop for supplying the feedback signal from the output to the keeper.

13. The domino logic circuit of claim 11, wherein the domino logic circuit is a keeperless domino logic circuit.

14. The domino logic circuit of claim 12, wherein the keeper has the first $V_t$.

15. The domino logic circuit of claim 12, wherein the keeper has the second $V_t$.

16. The domino logic circuit of claim 10, wherein the domino logic processing section is directly grounded.

17. The domino logic circuit of claim 16, further comprising:

a keeper, connected between the dynamic node and the voltage source, for selectively connecting the voltage source to the dynamic node in accordance with a feedback signal; and a feedback loop for supplying the feedback signal from the output to the keeper.

18. The domino logic circuit of claim 16, wherein the domino logic circuit is a keeperless domino logic circuit.

19. The domino logic circuit of claim 17, wherein the keeper has the first $V_t$.

20. The domino logic circuit of claim 17, wherein the keeper has the second $V_t$.

* * * * *